United States Patent
Thibaut et al.

(10) Patent No.: US 11,449,113 B2
(45) Date of Patent: Sep. 20, 2022

(54) POWER SUPPLY COMBINATION HAVING HETEROGENEOUS POWER SUPPLIES

(71) Applicant: OVH, Roubaix (FR)

(72) Inventors: Christophe Maurice Thibaut, Houplin Ancoisne (FR); Patrick-Gilles Maillot, Marsanne (FR)

(73) Assignee: OVH, Roubaix (FR)

( * ) Notice: Subject to any disclaimer, the term of this patent is extended or adjusted under 35 U.S.C. 154(b) by 0 days.

(21) Appl. No.: 17/241,588

(22) Filed: Apr. 27, 2021

(65) Prior Publication Data
US 2021/0373084 A1 Dec. 2, 2021

(30) Foreign Application Priority Data

May 28, 2020 (EP) .................................... 20315266
May 28, 2020 (EP) .................................... 20315267
May 28, 2020 (EP) .................................... 20315268

(51) Int. Cl.
*G06F 1/18* (2006.01)
*G06F 1/26* (2006.01)
(Continued)

(52) U.S. Cl.
CPC ............. *G06F 1/189* (2013.01); *G01R 31/40* (2013.01); *G06F 1/26* (2013.01); *G06F 1/28* (2013.01);
(Continued)

(58) Field of Classification Search
CPC . G01R 31/40; G06F 1/189; G06F 1/26; G06F 1/263; G06F 1/28; G06F 1/30;
(Continued)

(56) References Cited

U.S. PATENT DOCUMENTS 6,664,659 B1 12/2003 Adi
6,882,942 B1 4/2005 Duduman
(Continued)

FOREIGN PATENT DOCUMENTS

CN 201708546 U 1/2011
CN 201765556 U 3/2011
(Continued)

OTHER PUBLICATIONS

English Translation for CN201708546 retrieved on PatBase on Mar. 29, 2020.
(Continued)

*Primary Examiner* — Terrell S Johnson
(74) *Attorney, Agent, or Firm* — BCF LLP

(57) ABSTRACT

A power supply combination comprises two multi-voltage power sources having respective power rails delivering power at a first voltage and respective power rails delivering power at a second voltage. The power supply combination also comprises two single-voltage power sources having respective power rails delivering power at the first voltage. A first power combining circuit is electrically connected to the first voltage power rails of two multi-voltage power sources and to the two single-voltage power sources and delivers power at the first voltage to a first voltage input of a load. A second power combining circuit is electrically connected to the second voltage power rails of the two multi-voltage power sources and delivers power at the second voltage to a second voltage input of the load. A power supply network may connect a plurality of power supply combinations to a power management unit for reporting failures of the power sources.

15 Claims, 11 Drawing Sheets

(51) Int. Cl.
*H05K 7/14* (2006.01)
*G06F 1/30* (2006.01)
*H02J 1/10* (2006.01)
*G01R 31/40* (2020.01)
*G06F 1/28* (2006.01)
*H03K 5/24* (2006.01)

(52) U.S. Cl.
CPC ............... *G06F 1/305* (2013.01); *H02J 1/10* (2013.01); *H03K 5/24* (2013.01); *H05K 7/1457* (2013.01)

(58) Field of Classification Search
CPC .. G06F 1/305; H02J 1/10; H02J 9/061; H03K 5/24; H05K 7/1457
See application file for complete search history.

(56) References Cited

U.S. PATENT DOCUMENTS

| | | |
|---|---|---|
| 7,142,046 B1 | 11/2006 | Elbanhawy |
| 7,477,502 B1 | 1/2009 | Faulkner et al. |
| 8,200,990 B2 * | 6/2012 | Dishman .................. G06F 1/26 714/22 |
| 8,868,957 B2 | 10/2014 | Davis et al. |
| 9,235,248 B2 | 1/2016 | Cheng et al. |
| 9,531,283 B2 | 12/2016 | Shih et al. |
| 9,583,918 B1 | 2/2017 | Phan |
| 9,755,454 B1 * | 9/2017 | Reynov .................... H02J 9/06 |
| 9,800,089 B2 | 10/2017 | Sawada |
| 9,811,139 B2 | 11/2017 | Tsai |
| 9,991,703 B1 | 6/2018 | Maroney |
| 10,303,232 B2 | 5/2019 | Lu |
| 2004/0039536 A1 | 2/2004 | Garnett |
| 2004/0141285 A1 | 7/2004 | Lefebvre et al. |
| 2007/0260896 A1 | 11/2007 | Brundridge et al. |
| 2008/0266740 A1 * | 10/2008 | Smith ....................... H02J 1/10 323/283 |
| 2010/0223485 A1 | 9/2010 | Zou |
| 2010/0246233 A1 | 9/2010 | Campbell |
| 2012/0205976 A1 | 8/2012 | Shih et al. |
| 2015/0200566 A1 | 7/2015 | Huang et al. |

FOREIGN PATENT DOCUMENTS

| | | |
|---|---|---|
| CN | 107544654 A | 1/2018 |
| CN | 207008536 U | 2/2018 |
| CN | 209625107 U | 11/2019 |
| DE | 202017104725 U1 | 9/2017 |
| FR | 2932288 A1 | 12/2009 |
| KR | 101746434 B1 | 6/2017 |

OTHER PUBLICATIONS

English Translation for CN201765556 retrieved on PatBase on Mar. 29, 2020.
English Translation for CN207008536 retrieved on PatBase on Mar. 29, 2020.
Gebruder, "Parallel Connection of Switched-Mode Power Supplies", Gebruder Frei GmbH & Co., Jan. 1, 2015, available online at https://www.frei.de/assets/templates/frei/Dateien/Dateien/PDF/Stromversorgungen/en/Technische_Beschreibung_Parallelschaltung_ENGL.pdf, pp. 1-2.
English Translation for DE202017104725 retrieved on PatBase on Mar. 29, 2020.
LT4351, "MOSFET Diode-OR Controller", Linear Technology Corporation, 2003, www.linear.com, pp. 1-20.
English Translation for FR2932288 retrieved on PatBase on Mar. 29, 2020.
English Translation for CN209625107 on PatBase on Mar. 29, 2020.
English Translation for CN107544654 retrieved on PatBase on Mar. 29, 2020.
Extended European Search Report with regard to the EP Patent Application No. 20315266.5 completed Oct. 30, 2020.
Extended European Search Report with regard to the EP Patent Application No. 20315267.3 completed Oct. 30, 2020.
Extended European Search Report with regard to the EP Patent Application No. 20315268.1 completed Nov. 12, 2020.
English Translation for KR101746434 retrieved on Patentscope on Apr. 22, 2021.
ATX12V, "Power Supply Design Guide", Intel Corporation, Feb. 2003, Version 2.0, retrieved on Mar. 31, 2020, pp. 1-43.
Notice of Allowance with regard to the counterpart U.S. Appl. No. 17/237,855 dated Mar. 30, 2022.

* cited by examiner

POWER SUPPLY COMBINATION HAVING HETEROGENEOUS POWER SUPPLIES

CROSS-REFERENCE

The present application claims priority from European Patent Applications No. 20315266.5, No. 20315267.3, and No. 20315268.1, all of which were filed on May 28, 2020, the disclosure of all which is incorporated by reference herein in their entirety.

FIELD

The present technology relates to power delivery arrangements. In particular, the present disclosure introduces a power supply combination having heterogeneous power supplies.

BACKGROUND

Many devices such as servers in datacenters need to receive power at more than one voltage. ATX has become a de facto industry standard for powering servers at 12 volts DC, 3.3 volts DC and 5 volts DC. Apart from servers, other devices in datacenters and other devices in various industrial or commercial sites may require power at more than one voltage; for example and without limitation, electronic equipment such as discs and networking devices may consume power at 5 volts while cooling fans and water cooling pumps may consume power at 12 volts.

In large datacenters, power redundancy delivery is important, as many servers may be assigned to critically important functions. FIG. 1 (prior art) illustrates an arrangement in which a server receives power from an ATX power supply connected to a pair of redundant power supplies. In an arrangement 100, a first power source 110 and a second power source 120 receive power from an AC power supply (not shown) on their respective power inputs 112 and 122. Power rails 114 and 124 of the power supplies 110 and 120 deliver power at 12 volts DC to an ATX power supply 125 (a DC-DC converter in the case of FIG. 1). The power is delivered via diodes 140 and 150 that are both connected to a single power input 129 of the ATX power supply 125. The ATX power supply 125 provides power to a server 160. The diodes 140 and 150 ensure that power from one of the power supplies 110 and 120 cannot return to the other of the power supplies 110 and 120. Matching diodes 140 and 150 are selected to minimize any difference between their output voltages in order to prevent drawing most of the power from a single one of the power supplies 110 and 120. Ideal diodes may be used to minimize any voltage difference between the power rails 114, 124 and the power input 129. In more details, a power rail 126 of the ATX power supply 125 is connected to a power input 162 of the server 160 to deliver power at 12 volts. A power rail 127 of the ATX power supply 125 is connected to a power input 164 of the server 160 to deliver power at 3.3 volts. A power rail 128 of the ATX power supply 125 is connected to a power input 166 of the server 160 to deliver power at 5 volts.

In the illustrated example, the server 160 may consume up to 1000 watts, each power source 110 and 120 is capable of providing 1000 watts of power, and the ATX power supply 125 is also rated at 1000 watts. Tests have shown that a major portion of the power consumed by servers such as the server 160 of FIG. 1, for example 70% of the power, is consumed at 12 volts. In the ATX power supply 125, the power rail 126 is therefore required to support an output of up to 700 watts.

The two power supplies 110 and 120 are entirely redundant and, should one of them fail, the other remains able to fulfill the entire power requirement of the server 160. However, a problem to be solved lies in the fact the ATX power supply 125 becomes a single point of failure in the arrangement 100. Should the ATX power supply 125 fail entirely, or fail to provide power at 12, 3.3 or 5 volts, the server 160 may become unable to function properly.

Another problem to be solved relates to the risk of arcing when connecting the power inputs 162, 164 and 166 of the server 160 to the power rails 126, 127 and 128 of the ATX power supply 125. An initial connection is made between the server 160 and the ATX power supply 125 by establishment of a physical contact between the power inputs and the power rails. For a very brief moment, usually within a few milliseconds, this physical contact is unstable, being repeatedly established, disconnected and established again. Very high current peaks could be generated by these spurious interrupts, should the power be present on all power rails of the ATX power supply 125. FIG. 2 (prior art) shows a timing sequence for activation of the ATX power supply of FIG. 1. The timing sequence of FIG. 2 is implemented in an ATX specification in view of preventing damage causing by arcing to the ATX power supply 125 and/or to the server 160. Initially, no voltage is present on the power rails 126, 127 and 128 of the ATX power supply 125. A 5 volts standby power connection 170 (FIG. 1) present between the ATX power supply 125 and the server 160 allows a motherboard (not shown) of the server 160 to execute an initiation sequence. When the initiation sequence is completed, the server 160 sends a "PS_ON" signal to the ATX power supply 125 via a signalling lead 172 (FIG. 1). As shown on FIG. 2, the signal emitted by the server 160 on the signalling lead 172 changes from an initial high voltage to a low voltage—the PS_ON signal is thus deemed active when at the low voltage. In response to the PS_ON signal, the ATX power supply 125 starts raising the voltage on the power rails 126, 127 and 128. Within a time T1, generally less than 500 milliseconds after the PS_ON signal, the voltages at the power rails 126, 127 and 128 reach values close to their nominal 12, 3.3 and 5 volts ratings, for example reaching at least 95% of their rated voltages, within a time T2 of less than 20 milliseconds. After another delay T3, generally between 100 and 300 milliseconds, the ATX power supply 125 emits a "PWR_OK" (also called a "power good" signal) on a signalling lead 174 (FIG. 1). The PWR_OK signal has a brief rise time T4, generally less than 10 milliseconds. Having detected the PWR_OK signal, the server 160 can now operate using all required power from the power rails 126, 127 and 128 of the ATX power supply 125.

The timing sequence illustrated on FIG. 2 is illustrative and may vary according to various implementations. The various times T1, T2, T3 and T4 are provided for illustration only, as they may also vary in various implementations. Regardless, this timing sequence imposes a one-to-one correspondence between a given server 160 receiving power from a dedicated ATX power supply 125. This lack of flexibility in the configurations used to deliver power to servers is far from being ideal from economic and operational standpoints.

The power consumption of thousands or tens of thousands of servers hosted in large datacenters is considerable. There is a need for economical, flexible, optimized and redundant power delivery solutions.

Even though the recent developments identified above may provide benefits, improvements are still desirable.

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches.

SUMMARY

Embodiments of the present technology have been developed based on developers' appreciation of shortcomings associated with the prior art.

In particular, such shortcomings may comprise (1) the last of redundancy of the ATX power supplies used to provide power to servers and other loads; and/or (2) the lack of flexibility in the delivery of power to servers and other loads.

In one aspect, various implementations of the present technology provide a power supply combination, comprising:
- a first multi-voltage power source comprising a first power rail adapted to deliver power at a first voltage and a second power rail adapted to deliver power at a second voltage;
- a second multi-voltage power source comprising a third power rail adapted to deliver power at the first voltage and a fourth power rail adapted to deliver power at the second voltage;
- a first single-voltage power source comprising a fifth power rail adapted to deliver power at the first voltage;
- a second single-voltage power source comprising a sixth power rail adapted to deliver power at the first voltage;
- a first power combining circuit electrically connected to the first power rail of the first multi-voltage power source, to the third power rail of the second multi-voltage power source, to the fifth power rail of the first single-voltage power source, and to the sixth power rail of the second single-voltage power source, the first power combining circuit being adapted to deliver power at the first voltage to a first voltage input of a load; and
- a second power combining circuit electrically connected to the second power rail of the first multi-voltage power source and to the fourth power rail of the second multi-voltage power source, the second power combining circuit being adapted to deliver power at the second voltage to a second voltage input of the load.

In some implementations of the present technology, the load comprises one or more servers.

In some implementations of the present technology, the first power combining circuit comprises a first diode connecting the first power rail of the first multi-voltage power source to the first voltage input of the load, a third diode connecting the third power rail of the second multi-voltage power source to the first voltage input of the load, a fifth diode connecting the fifth power rail of the first single-voltage power source to the first voltage input of the load and a sixth diode connecting the sixth power rail of the second single-voltage power source to the first voltage input of the load; and the second power combining circuit comprises a second diode connecting the second power rail of the first multi-voltage power source to the second voltage input of the load and a fourth diode connecting the fourth power rail of the second multi-voltage power source to the second voltage input of the load.

In some implementations of the present technology, the first power combining circuit comprises a first emulating circuit connecting the first power rail of the first power source to the first voltage input of the load and a third emulating circuit connecting the third power rail of the second power source to the first voltage input of the load; the second power combining circuit comprises a second emulating circuit connecting the second power rail of the first power source to the second voltage input of the load and a fourth emulating circuit connecting the fourth power rail of the second power source to the second voltage input of the load; and each of the first, second, third, fourth, fifth and sixth emulating circuit is adapted to operate as an ideal diode.

In some implementations of the present technology, the power supply combination further comprises a first voltage comparator comprising: a first sensing input electrically connected to the first power rail of the first multi-voltage power source, and a third sensing input electrically connected to the third power rail of the second multi-voltage power source, a fifth sensing input electrically connected to the fifth power rail of the first single-voltage power source, a sixth sensing input electrically connected to the sixth power rail of the second single-voltage power source, the first voltage comparator being adapted compare voltages sensed by the first, third, fifth and sixth sensing inputs to detect a failure of one of the first and second multi-voltage power sources to deliver power at the first voltage or a failure of one of the first and second single-voltage power sources to deliver power at the first voltage; a second voltage comparator comprising: a second sensing input electrically connected to the second power rail of the first power source, and a fourth sensing input electrically connected to the fourth power rail of the second power source, the second voltage comparator being adapted compare voltages sensed by the second and fourth sensing inputs to detect a failure of one of the first and second power sources to deliver power at the second voltage; and a monitoring device operatively connected to the first and second voltage comparators and adapted to report a detected failure of one of the first and second multi-voltage power sources or a detected failure of one of the first and second single-voltage power sources.

In some implementations of the present technology, the first power combining circuit, the second power combining circuit, the first voltage comparator, the second voltage comparator and the monitoring device are mounted on a common platform.

In some implementations of the present technology, the first and second multi-voltage power sources are adapted to convert power received from a power distribution unit (PDU) into power delivered at the first and second voltages; the first and second single-voltage power sources are adapted to convert power received from the PDU into power delivered at the first voltage; and the monitoring device is communicatively connected to the PDU and is adapted send a signal to the PDU to report the detected failure of one of the first and second multi-voltage power sources or of one of the first and second single-voltage power sources.

In some implementations of the present technology, the first multi-voltage power source further comprises a seventh power rail adapted to deliver power at a third voltage; the second multi-voltage power source further comprises an eighth power rail adapted to deliver power at the third voltage; and the power supply combination further comprises a third power combining circuit electrically connected to the seventh power rail of the first power source and to the eighth power rail of the second power source, the second power combining circuit being adapted to deliver power at the third voltage to a third voltage input of the load.

In some implementations of the present technology, the first and second multi-voltage power sources are ATX power supplies; the first voltage is 12 volts DC; the second voltage is 3.3 volts DC; and the third voltage is 5 volts DC.

In some implementations of the present technology, the first power combining circuit comprises a first diode connecting the first power rail of the first multi-voltage power source to the first voltage input of the load, a third diode connecting the third power rail of the second multi-voltage power source to the first voltage input of the load, a fifth diode connecting the fifth power rail of the first single-voltage power source to the first voltage input of the load and a sixth diode connecting the sixth power rail of the second single-voltage power source to the first voltage input of the load; the second power combining circuit comprises a second diode connecting the second power rail of the first multi-voltage power source to the second voltage input of the load and a fourth diode connecting the fourth power rail of the second multi-voltage power source to the second voltage input of the load; and the third power combining circuit comprises a seventh diode connecting the seventh power rail of the first multi-voltage power source to the second voltage input of the load and an eighth diode connecting the eighth power rail of the second multi-voltage power source to the second voltage input of the load.

In some implementations of the present technology, the first power combining circuit comprises a first emulating circuit connecting the first power rail of the first power source to the first voltage input of the load and a third emulating circuit connecting the third power rail of the second power source to the first voltage input of the load; the second power combining circuit comprises a second emulating circuit connecting the second power rail of the first power source to the second voltage input of the load and a fourth emulating circuit connecting the fourth power rail of the second power source to the second voltage input of the load; the third power combining circuit comprises a fifth emulating circuit connecting the fifth power rail of the first power source to the third voltage input of the load and a sixth emulating circuit connecting the sixth power rail of the second power source to the third voltage input of the load; and each of the first, second, third, fourth, fifth, sixth, seventh and eighth emulating circuit is adapted to operate as an ideal diode.

In some implementations of the present technology, the power supply combination further comprises a first voltage comparator comprising: a first sensing input electrically connected to the first power rail of the first multi-voltage power source, and a third sensing input electrically connected to the third power rail of the second multi-voltage power source, a fifth sensing input electrically connected to the fifth power rail of the first single-voltage power source, a sixth sensing input electrically connected to the sixth power rail of the second single-voltage power source, the first voltage comparator being adapted compare voltages sensed by the first, third, fifth and sixth sensing inputs to detect a failure of one of the first and second multi-voltage power sources to deliver power at the first voltage or a failure of one of the first and second single-voltage power sources to deliver power at the first voltage; a second voltage comparator comprising: a second sensing input electrically connected to the second power rail of the first power source, and a fourth sensing input electrically connected to the fourth power rail of the second power source, the second voltage comparator being adapted compare voltages sensed by the second and fourth sensing inputs to detect a failure of one of the first and second power sources to deliver power at the second voltage; a third voltage comparator comprising: a seventh sensing input electrically connected to the seventh power rail of the first power source, and an eighth sensing input electrically connected to the eighth power rail of the second power source, the third voltage comparator being adapted compare voltages sensed by the seventh and eighth sensing inputs to detect a failure of one of the first and second power sources to deliver power at the third voltage; and a monitoring device operatively connected to the first, second and third voltage comparators and adapted to report a detected failure of one of the first and second multi-voltage power sources or a detected failure of one of the first and second single-voltage power sources.

In some implementations of the present technology, the first power combining circuit, the second power combining circuit, the third power combining circuit, the first voltage comparator, the second voltage comparator, the third voltage comparator and the monitoring device are mounted on a common platform.

In some implementations of the present technology, the first and second multi-voltage power sources are adapted to convert power received from a power distribution unit (PDU) into power delivered at the first, second and third voltages; the first and second single-voltage power sources are adapted to convert power received from the PDU into power delivered at the first voltage; and the monitoring device is communicatively connected to the PDU and is adapted send a signal to the PDU to report the detected failure of one of the first and second multi-voltage power sources or of one of the first and second single-voltage power sources.

In other aspects, various implementations of the present technology provide a power supply network, comprising:
  a plurality of power supply combinations; and
  a power management unit communicatively connected to the monitoring device of each of the power supply combinations, the power management unit being configured to:
    receive, from the monitoring devices, the reports of detected failures of any one of the multi-voltage power or single-voltage power sources of any one of the plurality of power supply combinations,
    determine a relative urgency related to each received report of detected failure, and
    cause a display to present each report of detected failure along with the corresponding relative urgency.

In the context of the present specification, unless expressly provided otherwise, a computer system may refer, but is not limited to, an "electronic device", an "operation system", a "system", a "computer-based system", a "controller unit", a "monitoring device", a "control device" and/or any combination thereof appropriate to the relevant task at hand.

In the context of the present specification, unless expressly provided otherwise, the expression "computer-readable medium" and "memory" are intended to include media of any nature and kind whatsoever, non-limiting examples of which include RAM, ROM, disks (CD-ROMs, DVDs, floppy disks, hard disk drives, etc.), USB keys, flash memory cards, solid state-drives, and tape drives. Still in the context of the present specification, "a" computer-readable medium and "the" computer-readable medium should not be construed as being the same computer-readable medium. To the contrary, and whenever appropriate, "a" computer-readable medium and "the" computer-readable medium may also be construed as a first computer-readable medium and a second computer-readable medium.

In the context of the present specification, unless expressly provided otherwise, the words "first", "second", "third", etc. have been used as adjectives only for the purpose of allowing for distinction between the nouns that they modify from one another, and not for the purpose of describing any particular relationship between those nouns.

Implementations of the present technology each have at least one of the above-mentioned object and/or aspects, but do not necessarily have all of them. It should be understood that some aspects of the present technology that have resulted from attempting to attain the above-mentioned object may not satisfy this object and/or may satisfy other objects not specifically recited herein.

Additional and/or alternative features, aspects and advantages of implementations of the present technology will become apparent from the following description, the accompanying drawings and the appended claims.

BRIEF DESCRIPTION OF THE DRAWINGS

For a better understanding of the present technology, as well as other aspects and further features thereof, reference is made to the following description which is to be used in conjunction with the accompanying drawings, where.

Figure 1:
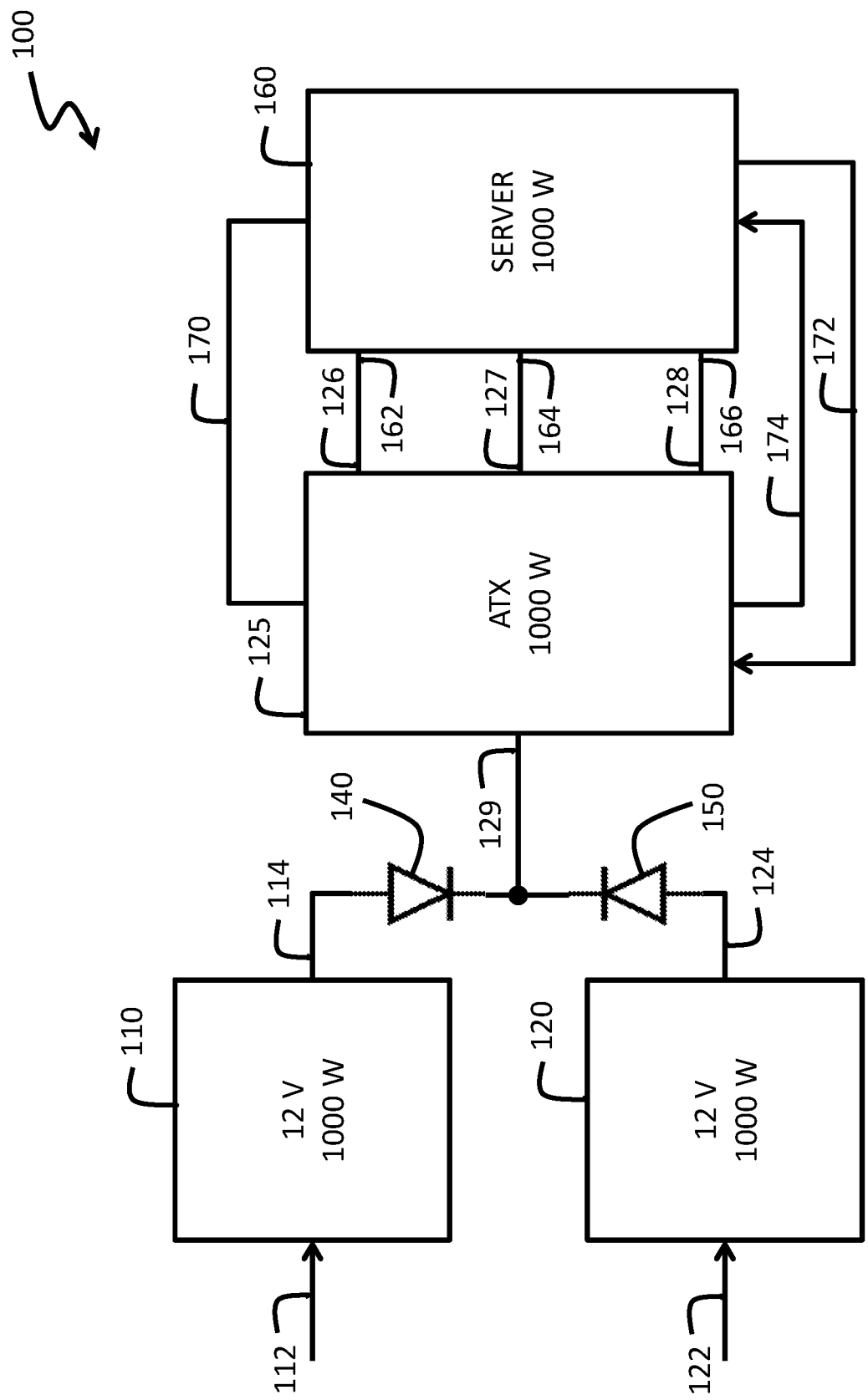
FIG. 1 (prior art) illustrates an arrangement in which a server receives power from an ATX power supply connected to a pair of redundant power supplies.

It should also be noted that, unless otherwise explicitly specified herein, the drawings are not to scale.

DETAILED DESCRIPTION

The examples and conditional language recited herein are principally intended to aid the reader in understanding the principles of the present technology and not to limit its scope to such specifically recited examples and conditions. It will be appreciated that those skilled in the art may devise various arrangements that, although not explicitly described or shown herein, nonetheless embody the principles of the present technology.

Furthermore, as an aid to understanding, the following description may describe relatively simplified implementations of the present technology. As persons skilled in the art would understand, various implementations of the present technology may be of a greater complexity.

In some cases, what are believed to be helpful examples of modifications to the present technology may also be set forth. This is done merely as an aid to understanding, and, again, not to define the scope or set forth the bounds of the present technology. These modifications are not an exhaustive list, and a person skilled in the art may make other modifications while nonetheless remaining within the scope of the present technology. Further, where no examples of modifications have been set forth, it should not be interpreted that no modifications are possible and/or that what is described is the sole manner of implementing that element of the present technology.

Moreover, all statements herein reciting principles, aspects, and implementations of the present technology, as well as specific examples thereof, are intended to encompass both structural and functional equivalents thereof, whether they are currently known or developed in the future. Thus, for example, it will be appreciated by those skilled in the art that any block diagrams herein represent conceptual views of illustrative circuitry embodying the principles of the present technology. Similarly, it will be appreciated that any flowcharts, flow diagrams, state transition diagrams, pseudo-code, and the like represent various processes that may be substantially represented in non-transitory computer-readable media and so executed by a computer or processor, whether or not such computer or processor is explicitly shown.

The functions of the various elements shown in the figures, including any functional block labeled as a "processor", may be provided through the use of dedicated hardware as well as hardware capable of executing software in association with appropriate software. When provided by a processor, the functions may be provided by a single dedicated processor, by a single shared processor, or by a plurality of individual processors, some of which may be shared. In some embodiments of the present technology, the processor may be a general-purpose processor, such as a central processing unit (CPU) or a processor dedicated to a specific purpose, such as a digital signal processor (DSP). Moreover, explicit use of the term a "processor" should not be construed to refer exclusively to hardware capable of executing software, and may implicitly include, without limitation, application specific integrated circuit (ASIC), field programmable gate array (FPGA), read-only memory (ROM) for storing software, random access memory (RAM), and non-volatile storage. Other hardware, conventional and/or custom, may also be included.

Software modules, or simply modules which are implied to be software, may be represented herein as any combination of flowchart elements or other elements indicating performance of process steps and/or textual description. Such modules may be executed by hardware that is expressly or implicitly shown. Moreover, it should be understood that module may include for example, but without being limitative, computer program logic, computer program instructions, software, stack, firmware, hardware circuitry or a combination thereof which provides the required capabilities.

In an aspect, the present technology, a power supply combination includes two power sources, for example and without limitation two ATX power supplies, the power sources delivering power at multiple voltages. Each power source includes two or three power rails for delivering power at two or three distinct voltages. A first combining circuit connects the two power rails of the power sources at a first voltage to a power input of a load, for example and without limitation a server or a group of servers. A second combining circuit connects the two power rails of the power sources at a second voltage to another power input of the load. A third combining circuit may connect the two power rails at a third voltage to a further power input of the load. The combining circuits may comprise diodes connecting the power rails of the two power sources at a same voltage to a respective power input of the load. Alternatively, the combining circuits may comprise emulating circuits that operate as ideal diodes to limit any voltage drop within the combining circuits. The various power rails of the power sources may be individually monitored in order to detect any partial or complete failure of the power sources.

In another aspect, the present technology, a power supply combination having heterogeneous power supplies. The power supply combination includes two multi-voltage power sources, for example and without limitation two ATX power supplies, and two single-voltage power sources. Each multi-voltage power source includes two or three power rails for delivering power at two or three distinct voltages. Each single-voltage power source includes a single power rail for delivering power at a first voltage. A first combining circuit connects the two power rails of the two multi-voltage power sources at the first voltage and the two power rails of the single-voltage power sources to a power input of a load, for example and without limitation a server or a group of servers. A second combining circuit connects the two power rails of the two multi-voltage power sources at a second voltage to another power input of the load. A third combining circuit may connect the two power rails of the two multi-voltage power sources at a third voltage to a further power input of the load. The combining circuits may comprise diodes connecting the power rails of the two multi-voltage power sources at the first voltage and the power rails of the two single-voltage power sources a first voltage input of the load. The combining circuits may also comprise diodes connecting the power rails of the two multi-voltage power sources at one or two other voltages to respective power inputs of the load. Alternatively, the combining circuits may comprise emulating circuits that operate as ideal diodes to limit any voltage drop within the combining circuits. The various power rails of the multi-voltage power sources and of the single-voltage power sources may be individually monitored in order to detect any partial or complete failure of any one of the power sources.

In a further aspect, the present technology a method and a control circuit are provided for controlling delivery of power to one or more servers. The control circuit is disposed between a power source and one or more servers. A conventional signalling exchange between the power source and a single server is replaced, on one hand, by an equivalent signalling exchange between the power source and the control circuit with the addition, on the other hand, by an equivalent signalling exchange between the control unit and each of the one or more servers. The power source is thus acting as if delivering power to only one server and each server is acting as if receiving power from a dedicated power source.

With these fundamentals in place, we will now consider some non-limiting examples to illustrate various implementations of aspects of the present technology.

Figure 3:
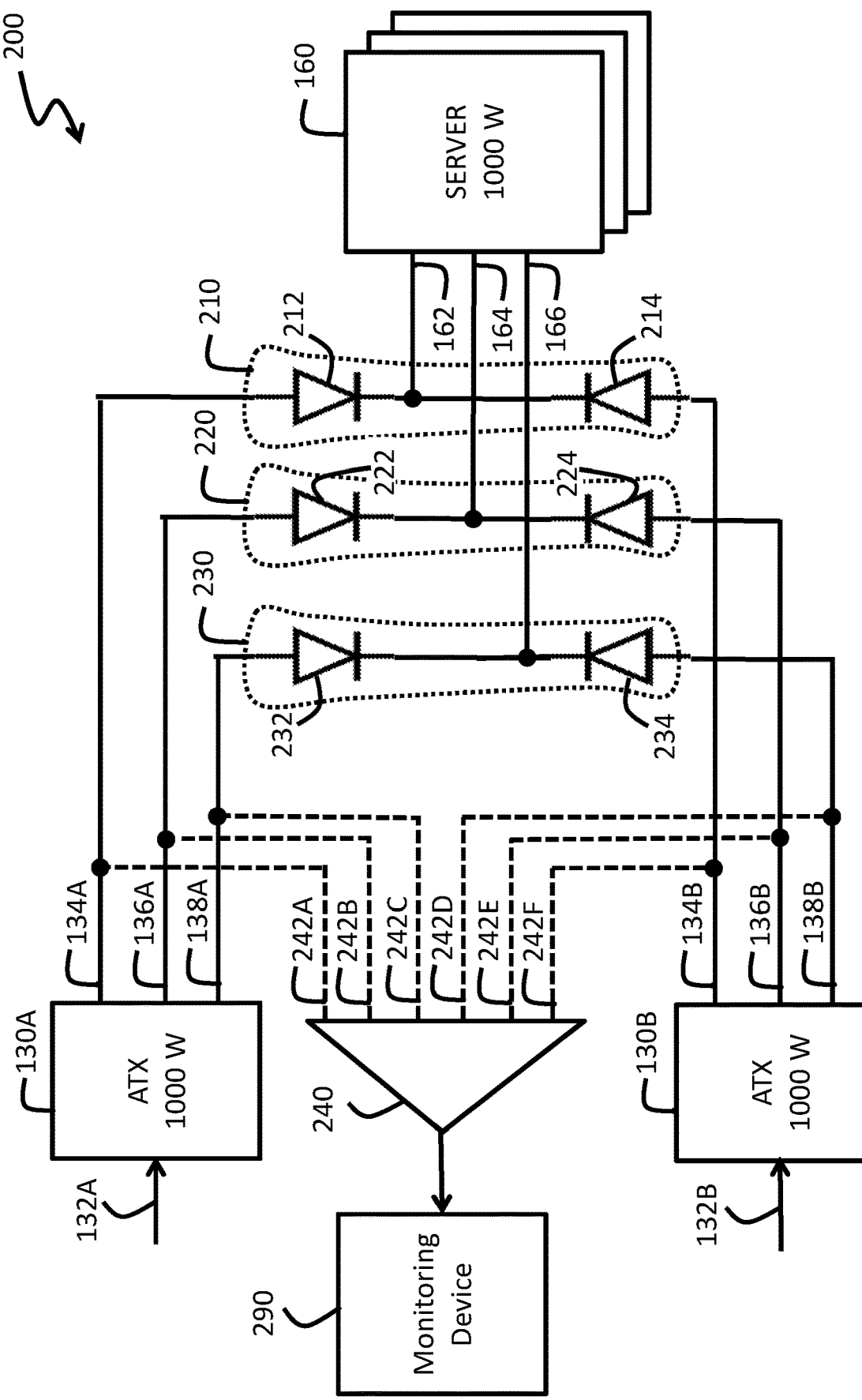
FIG. 3 is a block diagram of a redundant power supply configuration in accordance with an embodiment of the present technology.

FIG. 3 is a block diagram of a redundant power supply configuration in accordance with an embodiment of the present technology. As illustrated, a power supply combination 200 comprises two power sources that, in a non-limiting example, are ATX power supplies 130A and 130B. The ATX power supplies 130A and 130B respectively have power inputs 132A and 132B for receiving electric power, for example AC power, the electric power being received for example from a power distribution unit (PDU) shown in a later Figure. The two ATX power supplies 130A and 130B may receive electric power from the same PDU or from distinct PDUs. The ATX power supplies 130A and 130B convert the electric power into power delivered at three distinct DC voltages. It is contemplated that other multi-voltage power sources capable of converting the electric power into power delivered at two or more DC voltages may be present in the power supply combination 200 instead of the ATX power supplies 130A and 130B. Although the present description of FIG. 3 relates to the presence of three distinct voltages produced by the ATX power supplies 130A and 130B, the present technology encompasses power supply combinations delivering power at two or more DC voltages.

In more details, the ATX power supply 130A has a power rail 134A delivering power at a first voltage, a power rail 136A delivering power at a second voltage and a power rail 138A delivering power at a third voltage. The ATX power supply 130B has a power rail 134B delivering power at the first voltage, a power rail 136B delivering power at the second voltage and a power rail 138B delivering power at the third voltage. In the non-limiting example of FIG. 3, the ATX power supplies 130A and 130B deliver power at 12, 3.3 and 5 volts on their power rails. It should be understood that, in the context of the present disclosure, the first, second and third voltages may have different values that those of conventional ATX power supplies. It should also be understood that the terms "first", "second" and "third" are not meant to imply any precedence between the voltages and are not meant to relate to relative magnitudes of the voltages.

A power combining circuit 210 is electrically connected to the power rail 134A of the ATX power supply 130A and to the power rail 134B of the ATX power supply 130B. The power combining circuit 210 delivers power at the first voltage to a first voltage input of a load, for example a first voltage input 162 of a server 160 or first voltage inputs 162 of a group of servers 160. Another power combining circuit 220 is electrically connected to the power rail 136A of the ATX power supply 130A and to the power rail 136B of the ATX power supply 130B. The power combining circuit 220 delivers power at the second voltage to second voltage input(s) 164 of the server(s) 160. A further power combining circuit 230 is electrically connected to the power rail 138A of the ATX power supply 130A and to the power rail 138B of the ATX power supply 130B. The power combining circuit 230 delivers power at the third voltage to third voltage input(s) 166 of the server(s) 160. Although FIG. 3 shows that the ATX power supplies 130A and 130B are each capable of providing 1000 W of power and that the servers 160 may each consume 1000 W of power, it should be understood that each server 160 is expected to consume much less than the rated 1000 W most of the time, so that the combined power consumption of the servers 160 may remain within the capabilities of the ATX power supplies 130A and 130B. Regardless, the power ratings depicted on the various drawings are for illustration only and do not limit the present disclosure. Power supplies and loads having various rated power values are contemplated.

As illustrated, the load may comprise a plurality of servers 160, each server 160 having its own inputs 162, 164 and 166 for receiving power at the first, second and third voltages. Alternatively, the load may comprise one or more devices that, collectively, receive power at least at the first and second voltages. In a non-limiting example, the load may comprise a computer, a bunch of discs or networking devices receiving power at the first voltage and a cooling fan or a water cooling pump receiving power at the second voltage.

As illustrated, the power combining circuit 210 comprises a diode 212 connecting the power rail 134A of the ATX power supply 130A to the first voltage input(s) 162 of the server(s) 160. The power combining circuit 210 also comprises a diode 214 connecting the power rail 134B of the ATX power supply 130B to the first voltage input(s) 162 of the server(s) 160. The power combining circuit 220 comprises a diode 222 connecting the power rail 136A of the ATX power supply 130A to the second voltage input(s) 164 of the server(s) 160. The power combining circuit 220 also comprises a diode 224 connecting the power rail 136B of the ATX power supply 130B to the second voltage input(s) 164 of the server(s) 160. The power combining circuit 230 comprises a diode 232 connecting the power rail 138A of the ATX power supply 130A to the third voltage input(s) 166 of the server(s) 160. The power combining circuit 230 also comprises a diode 234 connecting the power rail 138B of the ATX power supply 130B to the third voltage input(s) 166 of the server(s) 160.

Figure 4:
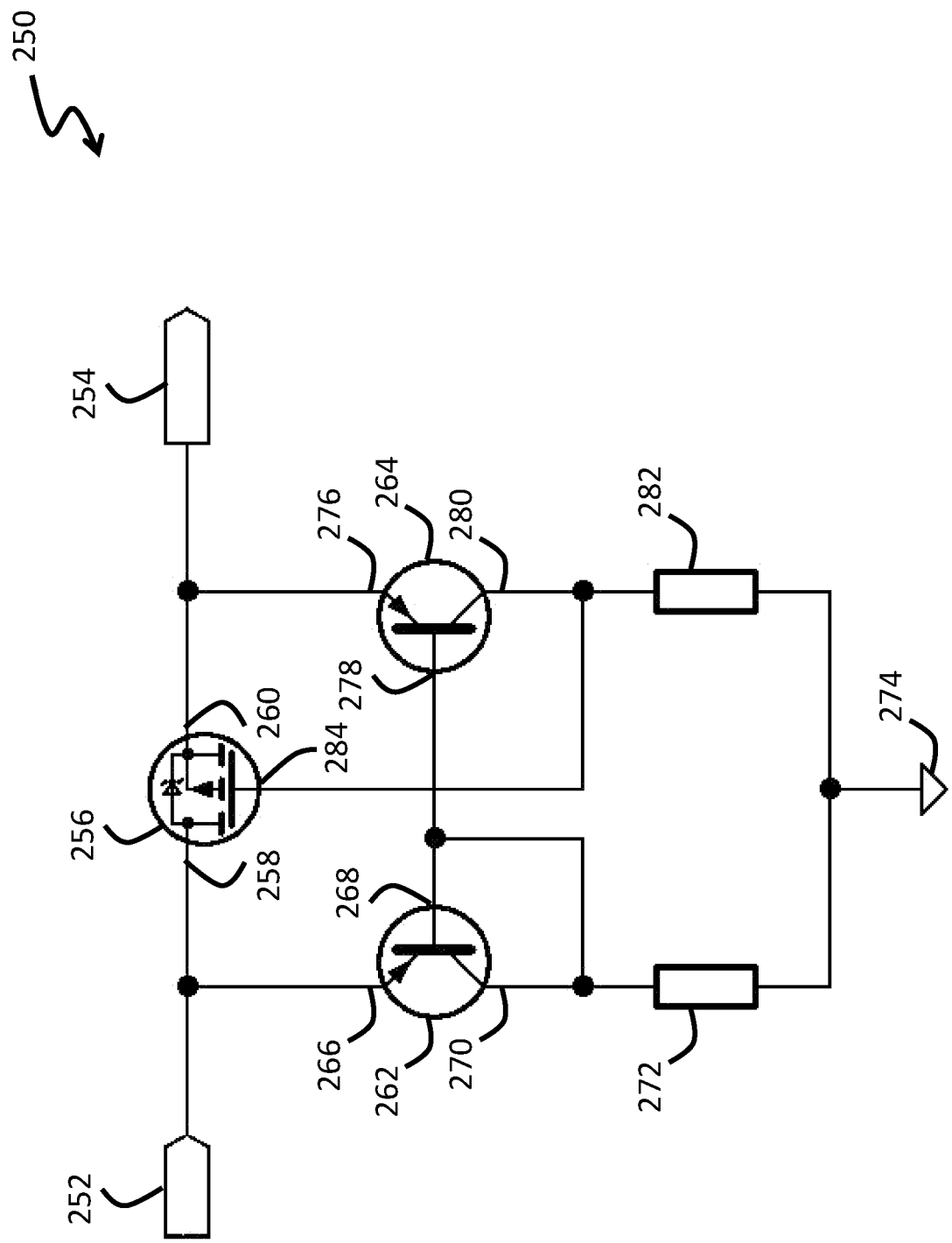
FIG. 4 is a circuit diagram of an emulating circuit according to an embodiment.

The diodes 212, 214, 222, 224, 232 and 234 may be substituted by emulating circuits that each operates as an ideal diode in order to limit any voltage drop within the combining circuits 210, 220 and 230. FIG. 4 is a circuit diagram of an emulating circuit according to an embodiment. An emulating circuit 250 comprises an input 252 that may be connected to any one of the power rails 134A, 136A, 138A, 134B, 136B or 138B of the ATX power supplies 130A or 130B, and an output 254 that may be connected to any one of the voltage inputs 162, 164 or 166 of the server 160. A p-channel MOSFET transistor 256 has its drain 258 connected to the input 252 and its source 260 connected to the output 254. A voltage comparator is formed by a pair of matched PNP transistors 262 and 264. The emitter 266 of the PNP transistor 262 is connected to the power input 252. The base 268 and the collector 270 of the PNP transistor 262 are connected to a resistor 272 that is further connected to ground 274. The emitter 276 of the PNP transistor 264 is connected to the output 254. The base 278 of the PNP transistor 264 is connected to the base 268 and the collector 270 of the PNP transistor 262. The collector 280 of the PNP transistor 264 is connected to a resistor 282 that is further connected to ground 274. The collector 280 of the PNP transistor 264 is also connected to the gate 284 of the MOSFET transistor 256.

In the emulating circuit 252, the resistors 272 and 282 have relatively high values, for example 10 K ohms, in order to limit power consumption. The MOSFET transistor 256 emulates a diode, allowing current to flow from the input 252 to the output 254 and not in the reverse direction. Should the voltage at the output 254 differ from the voltage at the input 252, a voltage at the gate 284 of the MOSFET transistor 256, which is also a voltage across the resistor 282, is adjusted to reduce this voltage difference. In an embodiment, the emulating circuit 250 may be integrated on a single chip, as this configuration facilitates matching of the PNP transistors 262 and 264, and matching of the resistors 272 and 282. Moreover, all components of the emulating circuit 250 may consistently react to temperature variations when integrated on a single chip.

The power supply combination 200 is not limited to using the diodes 212, 214, 222, 224, 232 and 234 or their replacement with the emulating circuit 250. It is contemplated by that one or more of the diodes 212, 214, 222, 224, 232 and 234 may be substituted with other emulating circuits operating substantially as ideal diodes.

Returning to FIG. 3, the power supply combination 200 may comprise voltage comparators adapted to detect differences of voltages between same voltage power rails of the ATX power supplies 130A and 130B. On FIG. 3, the voltage comparators are illustrated as a single multi-voltage comparator 240 for ease of illustration; however, 2 or 3 distinct voltage separators may be used to compare the 2 or 3 voltages on the power rails of the ATX power supplies 130A and 130B.

The voltage comparator 240 comprises a sensing input 242A electrically connected to the power rail 134A of the ATX power supply 130A and a sensing input 242F electrically connected to the power rail 134B of the ATX power supply 130B. The voltage comparator 240 compares the voltages sensed by the sensing inputs 242A and 242F. In normal operation, no significant difference should be detected between the sensing inputs 242A and 242F. Should any voltage difference be detected, one of the ATX power supplies 130A or 130B may be found to be failing to deliver power at the first voltage. A signal may be sent by the voltage comparator 240 to a monitoring device 290 to report that one of the ATX power supplies 130A or 130B appears to be failing to deliver power at the first voltage. In turn, the monitoring device 290 may be communicatively connected to a PDU (or PDUs, FIG. 6) that provides power to the ATX power supplies 130A and 130B and send a signal to the PDU to report the detected failure of one of the ATX power supplies 130A or 130B.

The voltage comparator 240 (or a distinct single-voltage comparator) also comprises a sensing input 242B electrically connected to the power rail 136A of the ATX power supply 130A and a sensing input 242E electrically connected to the power rail 136B of the ATX power supply 130B. The voltage comparator 240 compares the voltages sensed by the sensing inputs 242B and 242E to detect an eventual failure of one of the ATX power supplies 130A or 130B to deliver power at the second voltage. Likewise, the voltage comparator 240 (or a distinct single-voltage comparator) may also comprise a sensing input 242C electrically connected to the power rail 138A of the ATX power supply 130A and a sensing input 242D electrically connected to the power rail 138B of the ATX power supply 130B. The voltage comparator 240 may compare the voltages sensed by the sensing inputs 242C and 242D to detect an eventual failure of one of the ATX power supplies 130A or 130B to deliver power at the third voltage. Any failure of the ATX power supplies 130A or 130B to deliver power at the first, second or voltage may thus be reported to the monitoring device 290 that, in turn, reports the detected failure to the PDU.

The PDU may be part of power supply network (FIG. 6) in a datacenter, this network having oversight functions for monitoring the power consumption and redundant power delivery to all servers 160 in the datacenter. As a non-limiting example, a given PDU providing power to the ATX power supplies 130A and 130B may detect a drop of power consumed by the power supply combination 200. This detected drop of consumed power and information about the eventual failure of one of the ATX power supplies 130A or 130B may be used provide guidance to maintenance personnel who will then attend to repair or replace the failing power source.

In an embodiment of the power supply combination 200, the power combining circuits 210 and 220 (and 230, if present), the voltage comparator 240 (or distinct voltage comparators) and the monitoring device 290 may be mounted on a common platform (not shown), being for example mounted a single printed circuit board (PCB). The two ATX power supplies 130A and 130B may be connected to this common platform that, in turn, may be connected to the server(s) 160 while limiting the overall number of separate physical components.

Figure 5:
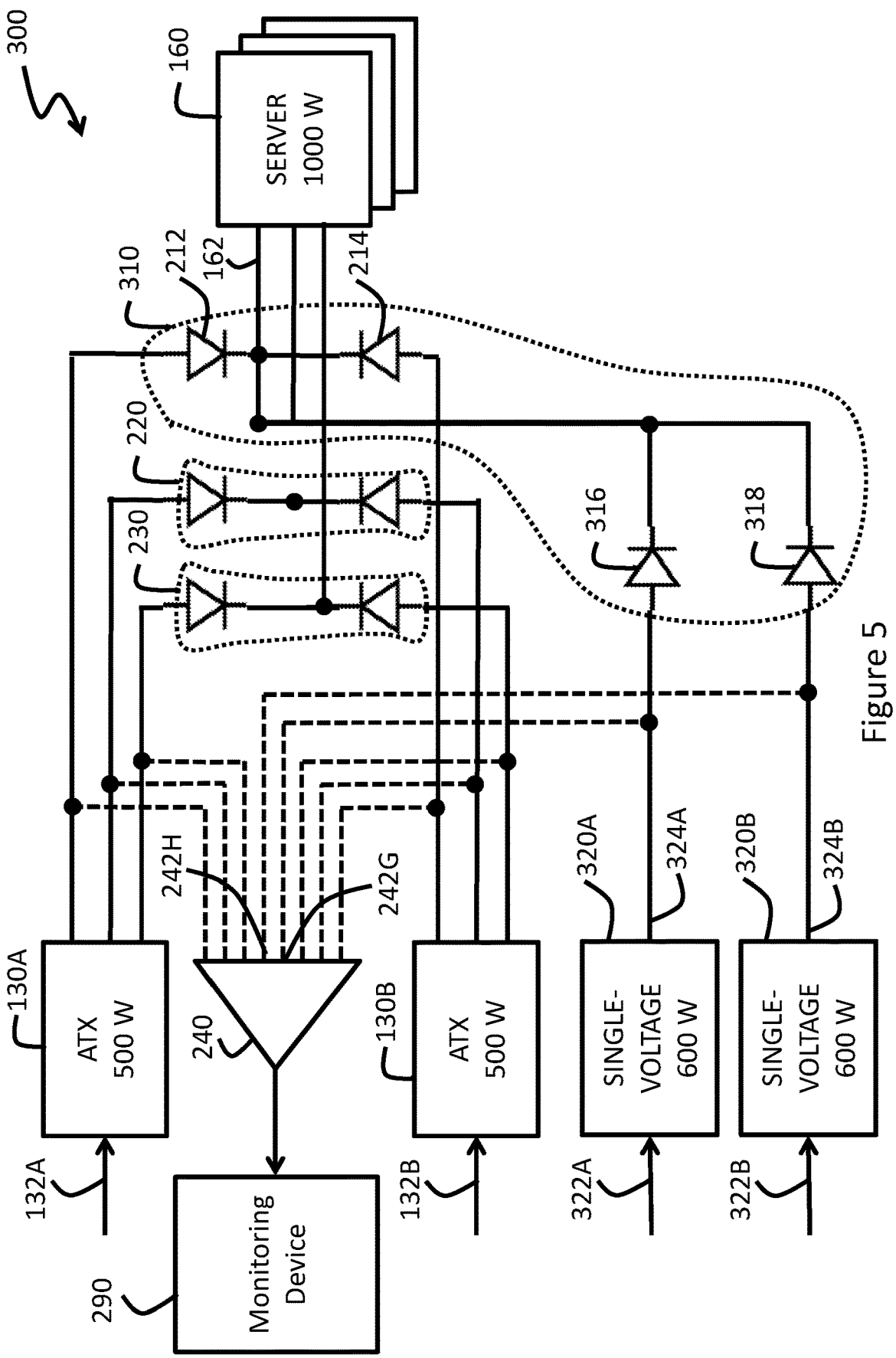
FIG. 5 is a block diagram of another redundant power supply configuration in accordance with an embodiment of the present technology.

Generally speaking, a major portion of the power consumed by the server 160 is consumed at one of its input voltages, for example and without limitation 70% of the power being consumed at 12 volts, which is the first voltage in the example of FIG. 3. Power supply redundancy may thus be provided differently for the first voltage that carries the most power when compared to other voltages. To this end, FIG. 5 is a block diagram of another redundant power supply configuration in accordance with an embodiment of the present technology. A power supply combination 300 includes many components of the power supply combination 200 introduced in the description of FIG. 2. A description of these components is not repeated herein for brevity, and the description of FIG. 5 will focus on differences between the power supply combinations 300 and 200. The ATX power supplies 130A and 130B may be labelled "multi-voltage power sources" for distinction with single-voltage power sources 320A and 320B that are present in the power supply combination 300. The ATX power supplies 130A and 130B may have lower power ratings that those shown on FIG. 3, given the presence of the single-voltage power sources 320A and 302B within the power supply combination 300.

In a non-limiting example where most of the power is consumed at the first voltage by the server 160, the single-voltage power sources 320A and 302B both receive AC power on their respective power inputs 322A and 322B and convert this power to the first voltage, which is 12 volts in the present example. The first voltage is present on respective power rails 324A and 324B of the single-voltage power sources 320A and 302B. The AC power may, for example, be received from the same PDU or PDUs that provide power to the ATX power supplies 130A and 130B, or from one or more other PDUs. In any case, the voltage on the power rails 324A and 324B of the single-voltage power sources 320A and 302B matches a voltage present on one of the power rails of each of the ATX power supplies 130A and 130B.

In the power supply combination 300, the diodes 212 and 214, which respectively connect the power rail 134A of the ATX power supply 130A and the power rail 134B of the ATX power supply 130B to the first voltage input(s) 162 of the server(s) 160, are now part of a power combining circuit 310 that further includes diodes 316 and 318 that respectively connect the power rail 324A of the single-voltage power source 320A and the power rail 324B of the single-voltage power source 320B to the first voltage input(s) 162 of the server(s) 160. The voltage comparator 240 (or an additional single-voltage comparator) further comprises a sensing input 242G electrically connected to the power rail 320A of the single-voltage power source 320A and a sensing input 242H electrically connected to the power rail 324B of the single-voltage power source 320B. The voltage comparator 240 compares the voltages sensed by the sensing inputs 242G and 242H. In normal operation, no significant difference should be detected between the sensing inputs 242G and 242H. Should any voltage difference be detected, one of the single-voltage power sources 320A or 320B may be found to be failing to deliver power at the first voltage. A signal may be sent by the voltage comparator 240 to the monitoring device 290 to report that one of the single-voltage power sources 320A or 320B appears to be failing to deliver power at the first voltage. In turn, the monitoring device 290 may be communicatively connected to the PDU (or PDUs) that provides power to the single-voltage power sources 320A or 320B and send a signal to the PDU to report the detected failure of single-voltage power sources 320A or 320B.

Figure 6:
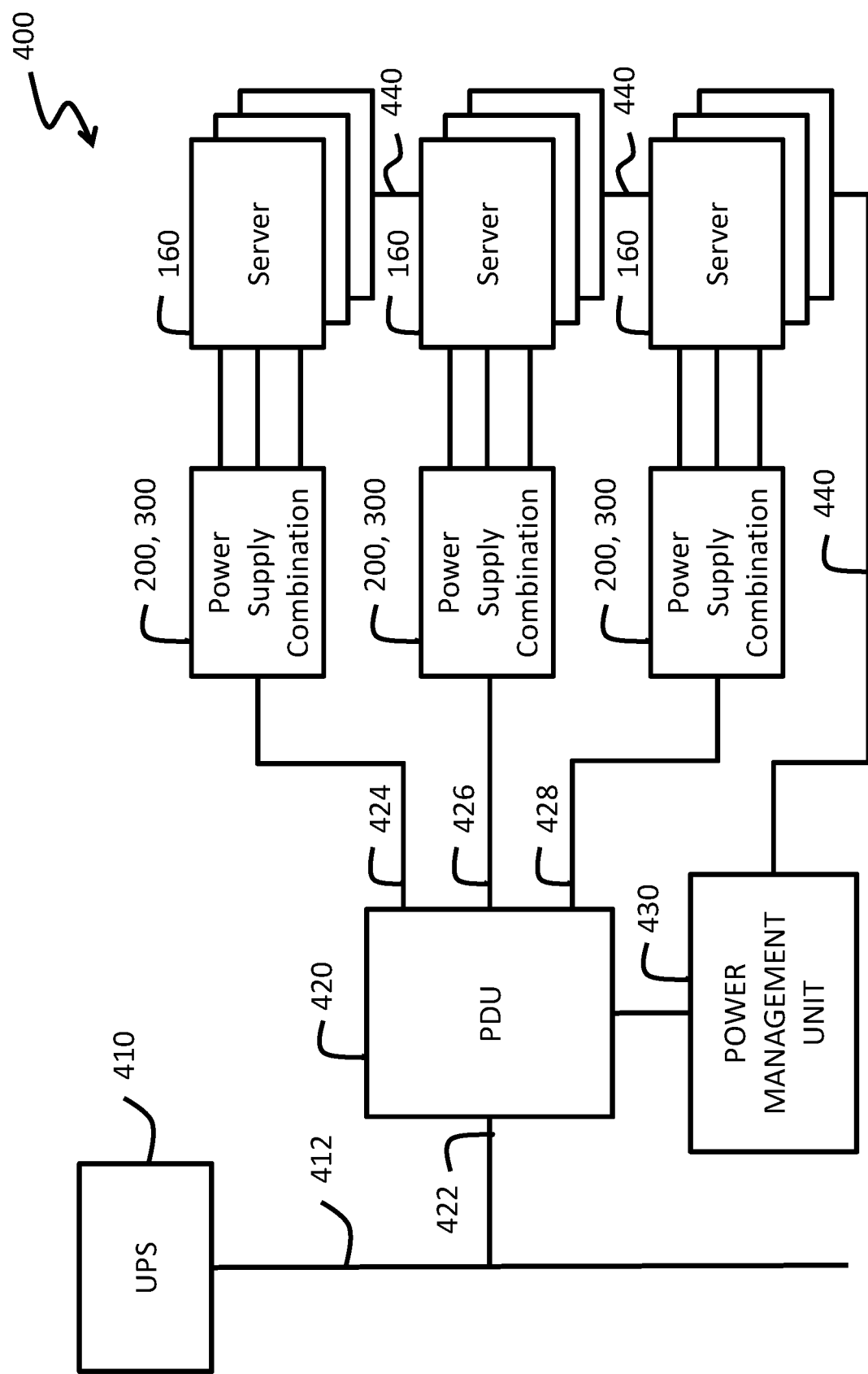
FIG. 6 is a block diagram of a further redundant power supply configuration in accordance with an embodiment of the present technology.

FIG. 6 is a block diagram of a redundant power supply network in accordance with an embodiment of the present technology. A power supply network 400 may provide power at a plurality of voltages to a large number of servers 160 and/or to other loads in a datacenter. Several servers 160 may receive power from each of a plurality of power supply configurations 200 or 300. Each power supply configuration 200 or 300 may receive power from one or uninterrupted power supplies (UPS) 410 (only one is shown for simplicity) via one or more PDUs 420 (only one is shown for simplicity). It should be understood that a large datacenter may comprise hundreds or thousands of UPSs 410, hundreds or thousands of PDUs 420, hundreds or thousands of power supply configurations 200 or 300, and thousands or tens of thousands of servers 160.

Each UPS 410 receives power from a sector, each UPS 410 comprising a battery (not shown) allowing to continuously deliver power in case of failure of the sector. AC power, for example at 110 VAC or 220 VAC, is delivered on a power rail 412 of each UPS 410. Each PDU 420 receives AC power from a respective power rail 412 at its power input 422 and delivers AC power at a plurality of power outputs, such as power outputs 424, 426 and 428. The PDU 420 may include more or less power outputs than as shown on FIG. 6. The power supply combinations 200 or 300 receive power from the power outputs 424, 426 and 428. In each power supply combination 200 or 300, the monitoring device 290 (FIGS. 3 and 5) may communicate with the respective PDU 420 to report any detected failure of one of the ATX power supplies 130A or 130B or of one of the single-voltage power sources 320A or 320B. Signalling between the monitoring devices 290 and the PDUs 420 may take place over dedicated signalling paths (not shown). Alternatively, the signalling may be carried over AC power leads connecting the power outputs 424, 426 and 428 of the PDUs 420 to the power supply combination 200 or 300, for example using a power line communication (PLC) protocol.

Figure 7:
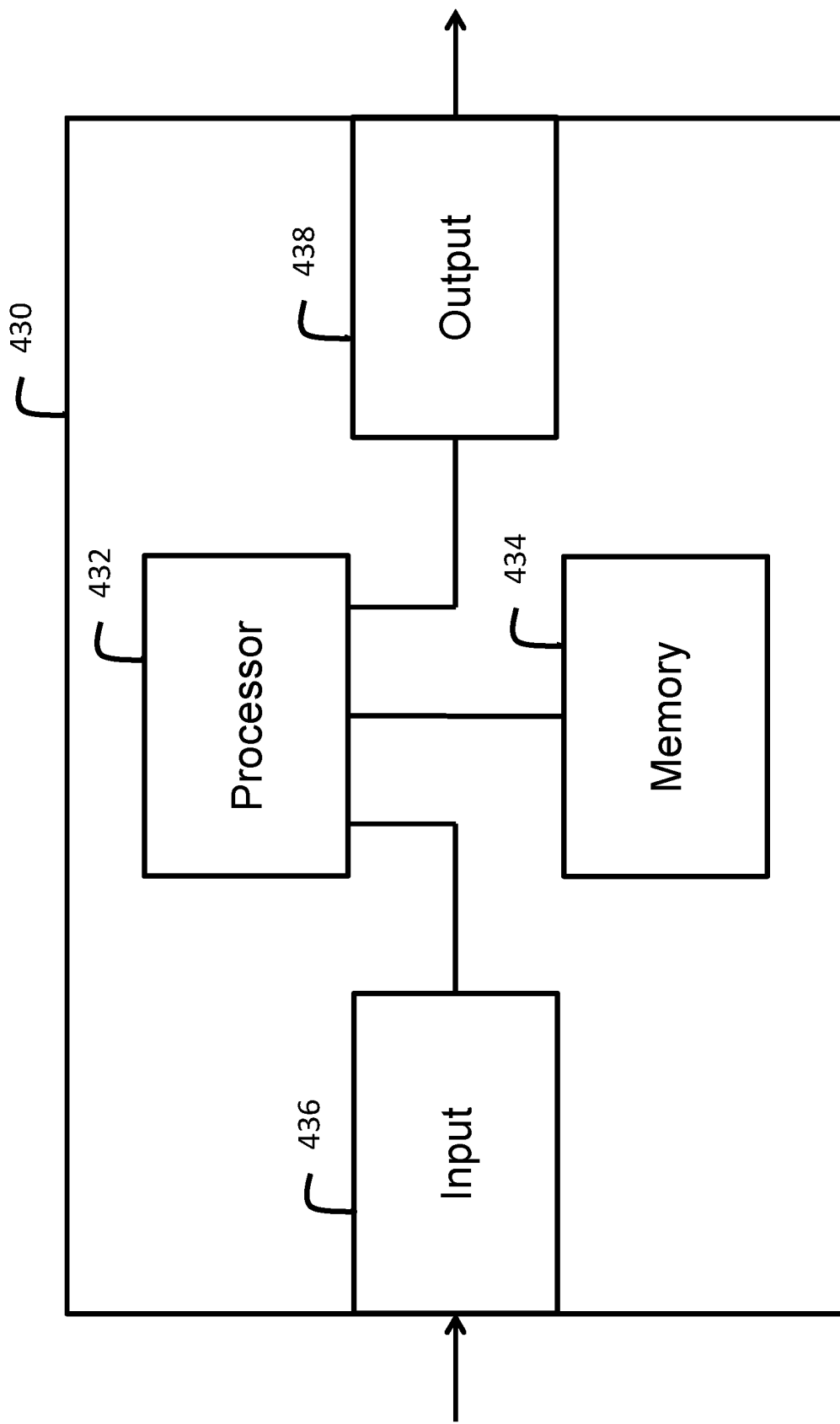
FIG. 7 is a block diagram of a power management unit according to an embodiment.

The power supply network 400 comprises at least one power management unit 430. FIG. 7 is a block diagram of a power management unit according to an embodiment. The power management unit 430 comprises a processor or a plurality of cooperating processors (represented as a processor 432 for simplicity), a memory device or a plurality of memory devices (represented as a memory device 434 for simplicity), an input device or a plurality of input devices (represented as an input device 436) and an output device or a plurality of output devices (represented as an output device 438). The input device 436 and the output device 438 may be combined in an input/output device. The processor 432 is operatively connected to the memory device 434, to the input device 436 and to the output device 438. The memory device 434 may store characteristics of the various power supplies, of servers and of other loads of the datacenter. The memory device 434 may also comprise a non-transitory computer-readable media for storing instructions that are executable by the processor 432 to allow the power management unit 430 to perform is designated functions.

In the power supply network 400, the power management unit 430 may be duplicated in order to provide redundancy of its functions. Each PDU 420 may detect an unexpected variation, for example a reduction, of power consumed through the power supply combination 200 or 300 connected to one of its power outputs such as the power outputs 424, 426 and 428. The PDU 420 may forward a report to received at the input device 436 of the power management unit 430, the report containing an identification of its power output 424, 426 and 428 on which a power variation has been detected for use in identifying the power supply combination 200 or 300 connected thereto. The power management unit 430 may also be communicatively connected to the various monitoring devices 290, via the PDUs 420 or via other signalling leads (not shown). The power management unit 430 may receive reports, from the various monitoring devices 290, about detected failures of any one of the ATX power supplies 130A or 130B or of one of the single-voltage power sources 320A or 320B, these reports being transmitted to the power management unit 430 via the various PDUs 420 and received at the input device 436. Reports originating from the monitoring devices 290 provide a finer level of details than the reports originating from the PDUs 420, given that they may identify specific power supplies and, for multi-voltage power supplies, identify losses of power at specific voltages. The processor 432 may log these various reports in the memory device 434 of the power management unit 430.

The processor 432 of the power management unit 430 may be programmed to determine the relative urgency associated to the various failures according to the type of a power supply having a failure, historical information about the reliability of the various types of power supplies, the voltage at which the failure takes place and the level of redundancy for that voltage within a given power supply combination 200 or 300, and the criticality of features supported by the load or loads powered by the failed power supplies, these characteristics being stored in the memory device 434. The power management unit 430 may cause a display (not shown) connected to the output device 438 to present the reports and the associated relative urgency to an operator. This presentation may express a relative urgency of attending to the failing power sources. The processor 432 uses information about the reports and the characteristics of the various power supplies, servers and other loads stored in the memory device 424 to evaluate this relative urgency. Considering for example the power supply combination 300 of FIG. 5, a failure of the ATX power supply 130A to provide power at 12 volts on its power rail 134A while the ATX power supply 130A continues delivering power at 3.3 volts and at 5 volts on its power rails 136A and 138A may be considered a low urgency situation, given that the single-voltage power supplies 320A and 320B may have sufficient capacity to continue providing most of the required power at 12 volts to the servers 160. In the same power supply combination 300 of FIG. 5, the failure of one of the single-voltage power supplies 320A and 320B may be considered a high urgency situation because the collective capacities of the remaining power supplies may barely suffice to provide power at 12 volts to the servers 160. In another example, a failure of one of the ATX power supplies 130A or 130B to provide power at 3.3 volts or at 5 volts to the servers 160 may be considered a medium urgency situation if the other one of the ATX power supplies 130A or 130B has sufficient capacity to supply the necessary power to the servers 160. In yet another example in which processors (not shown) receive power from the power supply combination 200 or 300 at a first voltage and cooling fans (not shown) receive power from the power supply combination 200 or 300 at a second voltage, a loss of power from one of the power supplies at the first voltage may be considered a high urgency situation because a total lower of power at the first voltage could cause a total loss of functions supported by the processors. In the same example, a loss of power from one of the power supplies at the second voltage may be considered a low urgency situation because the processors could be expected to continue operating for at least some time following a loss of cooling from the cooling fans resulting from a total loss of power at the second voltage.

The power management unit 430 may also be communicatively connected, via a signalling path 440 connected to the output device 438, to each of the servers 160 within the power supply network 400. In the power management unit 430, the processor 432 may monitor a combined power level of the power sources of each of the power supply combinations 200 or 300. For each given power supply combination 200 or 300, if a combined power consumption of the plurality of servers 160 connected thereto exceeds the combined power level of the power sources contained in that given power supply combination 200 or 300, the power management unit 430 may send a command at least one of the plurality of servers 160 causing that server 160 to reduce its power consumption. The processor 432 may use configuration information contained in the memory device 434 to determine which particular server 160 may be instructed to reduce its power consumption. It may be noted that the power consumption of a given server 160 may be reduced to zero, meaning that the given server 160 may be temporality taken out of service.

Figure 2:
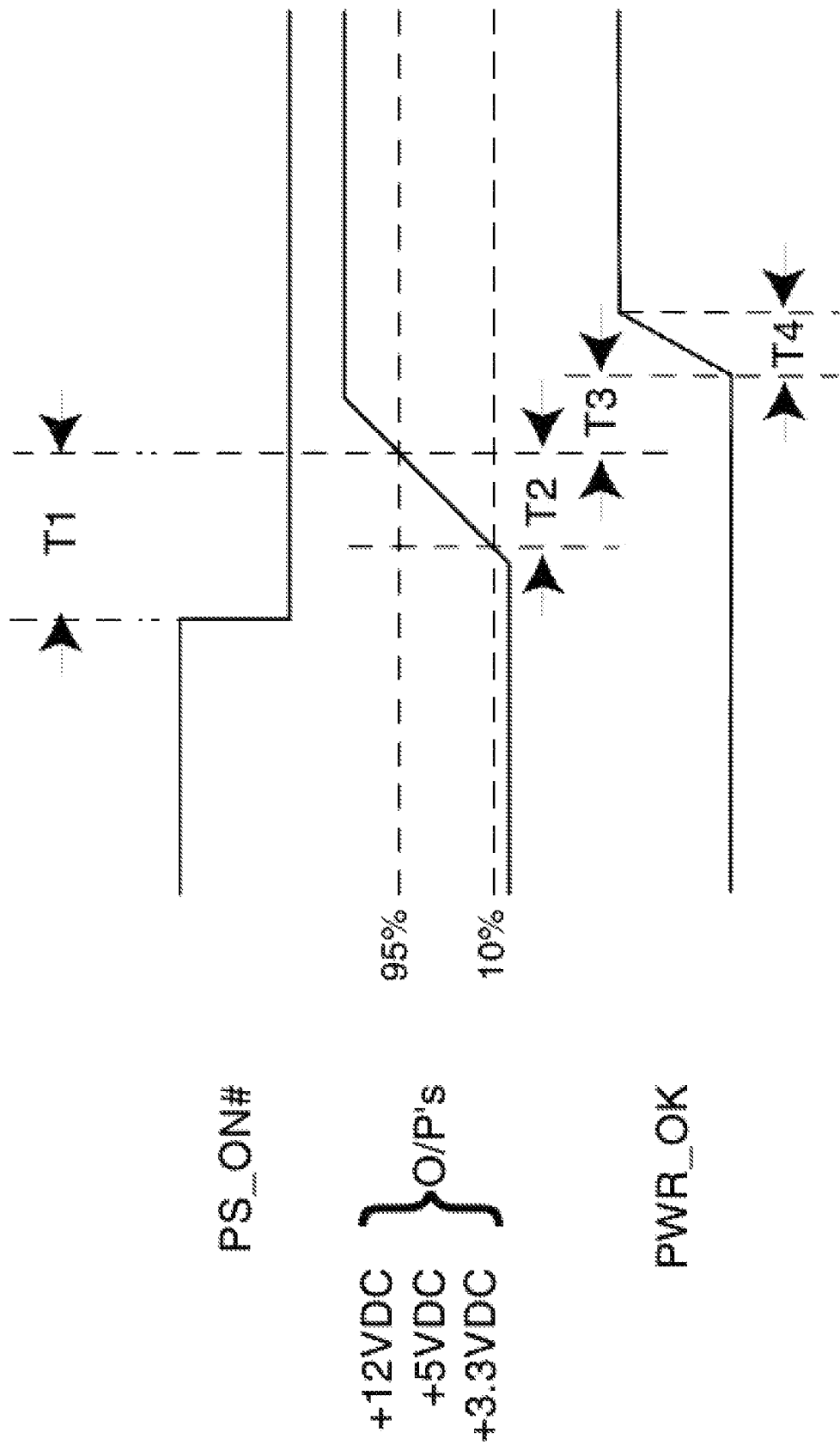
FIG. 2 (prior art) shows a timing sequence for activation of the ATX power supply of FIG. 1.

As expressed in the foregoing description of FIGS. 1 and 2, the ATX standard implies the initial delivery of a 5 volts standby power via a connection 170 (FIG. 1) present between the ATX power supply 125 and the server 160. This standby power allows a motherboard (not shown) of the server 160 to execute an initiation sequence. When the initiation sequence is completed, the server 160 sends a PS_ON signal to the ATX power supply 125 on a signalling lead 172. Having received the PS_ON signal, the ATX power supply 125 starts raising the voltages on the power rails 126, 127 and 128, following which the ATX power supply 125 emits a PWR_OK signal on a signalling lead 174. The PWR_OK informs the server 160 that power is now available on all of its power inputs 162, 164 and 166. The server 160 may now perform its various operations. Because the sequence of FIG. 2 delays the delivery of power to the server 160, risks of arcing at the connection between the power rails 126, 127 and 128 of the ATX power supply 125 and the power inputs 162, 164 and 166 of the server 160 are greatly alleviated.

However, the sequence of FIG. 2 is intended for allowing a single ATX power supply 125 to provide power to a single server 160. When physically connecting the single server 160 to the ATX power supply 125, no voltage is present on the power rails 126, 127 and 128 of the ATX power supply 125. In the context of the power supply combination 200 or 300, one or more servers 160 may be operational and more servers 160 may be added to the same power supply combination 200 or 300. Hot plugging of a server 160 to the ATX power supplies 130A and 130B (and to the single-voltage power supplies 320A and 320B, if present) cannot be performed in the conventional manner. A newly connected server 160 would need to receive a PWR_OK signal in order to start using the power available at its power inputs 162, 164, 166. The ATX power supplies 130A and 130B cannot initiate sending anew PWR_OK signal within first receiving a PS_ON signal from the newly connected server 160. Depending on their construction, the ATX power supplies 130A and 130B may not properly handle a PS_ON signal received from the newly connected server 160 when it is already providing power to other servers 160. Additionally, should the ATX power supplies 130A and 130B emit a PWR_OK signal in response to a just received PS_ON signal, the other servers 160 might react improperly, as they are not configured to receive a PWR_OK signal when they are already in operation.

In fact, the same problem may occur in a power supply confirmation having a single ATX power supply 125, 130A or 130B. Assuming that the single ATX power supply 125, 130A or 130B is already providing power to a first server 160, hot plugging a second server 160 to the ATX power supply 125, 130A or 130B could generate the same damages causing by arcing to the ATX power supply 125, 130A or 130B and/or to the second server 160.

Figure 8:
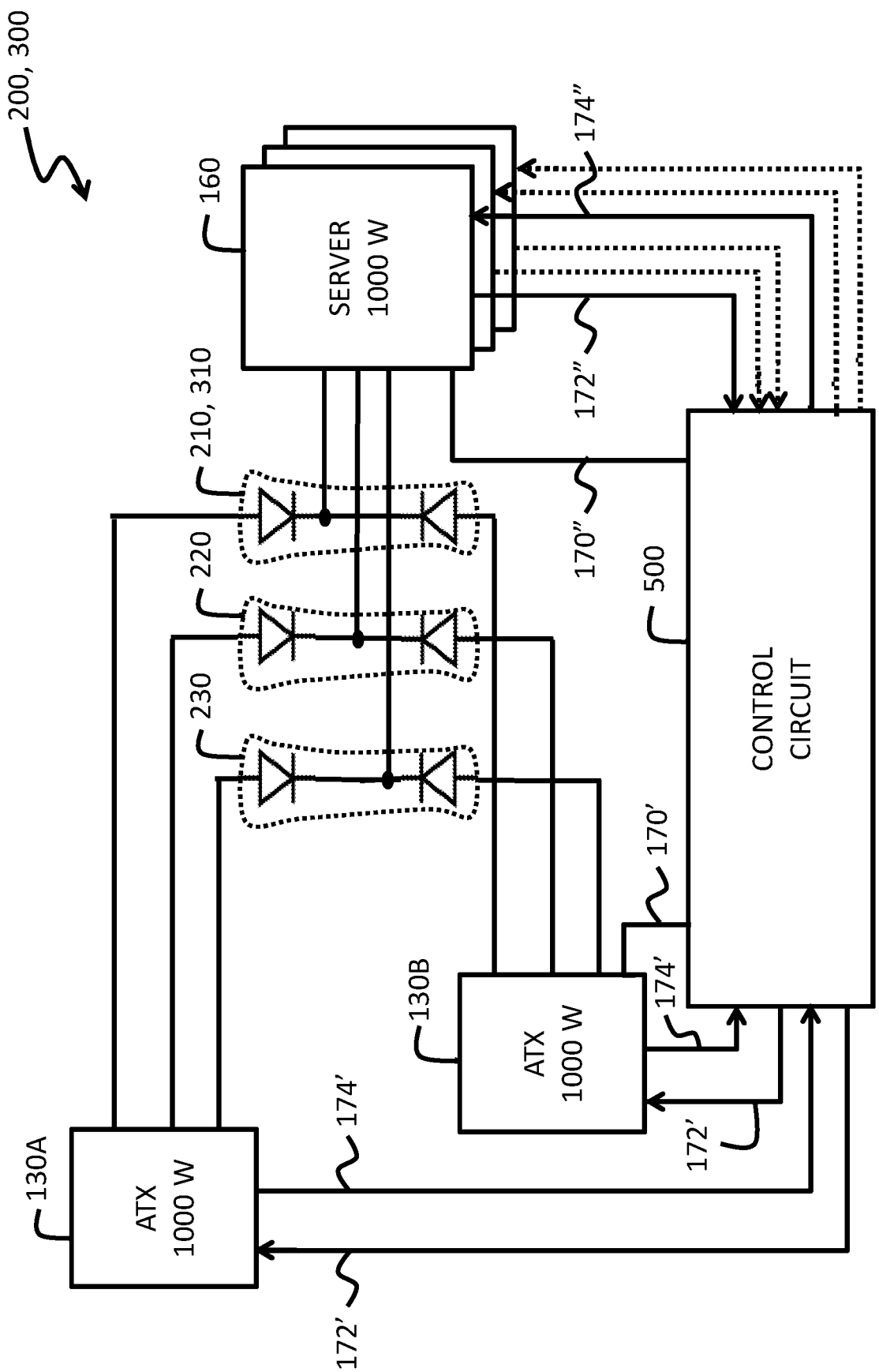
FIG. 8 is a block diagram showing some components of the power supply configurations of FIGS. 3 and 5, also showing a control circuit for hot plugging of loads according to an embodiment.

FIG. 8 is a block diagram showing some components of the power supply configurations of FIGS. 3 and 5, also showing a control circuit for hot plugging of loads according to an embodiment. FIG. 8 reproduces some components of power supply combination 200 or 300. Various components are omitted for ease of illustration; it should however be understood that the features described in relation to the description of FIG. 8 may apply to any embodiment based on FIGS. 3 and 5. In an embodiment, a control circuit 500 is added to the power supply combination 200 or 300. The control circuit 500 is provided to allow hot plugging of a number of servers 160 to the power supply combination 200 or 300.

In an embodiment, a connection 170' is established from one of the ATX power supplies 130A or 130B to the control circuit 500. For redundancy purposes, connections 170' may be established from both ATX power supplies 130A and 130B to the control circuit 500. When the power supply combination 200 or 300 starts receiving power from a PDU 420, the control circuit 500 starts receiving 5 volts standby power via the connection(s) 170'. Soon thereafter, the control circuit 500 sends a PS_ON signal to each of the ATX power supplies 130A and 130B, via respective signalling leads 172'. When they are ready to provide power on all of their respective power rails, the ATX power supplies 130A and 130B send PWR_OK signals to the control circuit 500 via respective signalling leads 174'. When PWR_OK signals have been received from both ATX power supplies 130A and 130B, the control circuit 500 determines that power can be delivered to the server(s) 160. In a configuration containing a single ATX power supply 125, 130A or 130B, the control circuit 500 may determine that power can be delivered to the server(s) 160 after receiving the PWR_OK signal from the single ATX power supply 125, 130A or 130B.

Each server 160 may receive 5 volts standby power via a respective connection 170 (FIG. 1) extending from one of the ATX power supplies 130A or 130B, or via a respective connection 170" extending from the control circuit 500. When ready, each given server 160 sends a PS_ON signal to the control circuit 500 via a respective signalling lead 172". In response, the control circuit 500 sends a PWR_OK signal to given server 160 via a respective signalling lead 174".

To hot plug an additional server 160 to the power supply combination 200 or 300 when some servers 160 are already in operation, the power inputs 162, 164 and 166 of the additional server 160 are respectively connected to the power combining circuit 210 or 310, and to the power combining circuits 220 and 230. The additional server 160 is also connected to one of the available sources of 5 volts standby power, directly from the ATX power supplies 130A or 130B via a respective connection 170, or from the control circuit 500 via a respective connection 170". Respective signalling leads 172" and 174" are connected between the additional server 160 and the control circuit 150. Having performed its initiation sequence, the additional server 160 sends a PS_ON signal to the control circuit 500 via the respective signalling lead 172". Following a brief delay, for example 300 to 500 milliseconds, the control circuit 500 responds with a PWR_OK signal sent via the respective signalling lead 174". The additional server 160 is now ready to receive power at its power inputs 162, 164 and 166 from the power supply combination 200 or 300.

In the power supply combination 200 or 300, when used with the control circuit 500, each ATX power supply 130A and 130B is therefore made to behave as if it were providing power to one single server and each server 160 is made to behave as it is were powered by a dedicated ATX power supply. Each server 160 starts operating after received their respective PWR_OK signal, using power present on its power inputs 162, 164 and 166, when their connection to the power combining circuits is established in a stable manner, so that risk of arcing is greatly alleviated.

There is no a priori limitation to the number of ATX power supplies 130A or 130B and to the number of servers 160 that may be connected to the control circuit 500. The control circuit 500 may be implemented using hardware components, or software components, or a combination thereof. For example, the control circuit 500 may comprise a number of logic circuit elements (not shown) assembled to receive 5 volts standby power on the connection 170', receive the PWR_OK signal on the signaling lead 174', and receive the PS_ON signal on the signalling lead 172", the logic circuit elements also applying the 5 volts standby power on the connection 70", sending the PS_ON signal on the signalling lead 172', and sending the PWR_OK signal on the signalling lead 174", the signals being received and sent according to the above-described sequence. In another example, the signalling leads 172, 172", 174' and 174" may be implemented using a bus connected the control circuit 500 to the ATX power supplies 130A and 130B and to the server(2) 160. In an example where the servers 160 are assembled in a rack (not shown), the control circuit 500 may be mounted in a backplane (not shown) of the rack. In such case, one instance of the control circuit 500 may be mounted in the backplane of each rack.

Figure 9A:
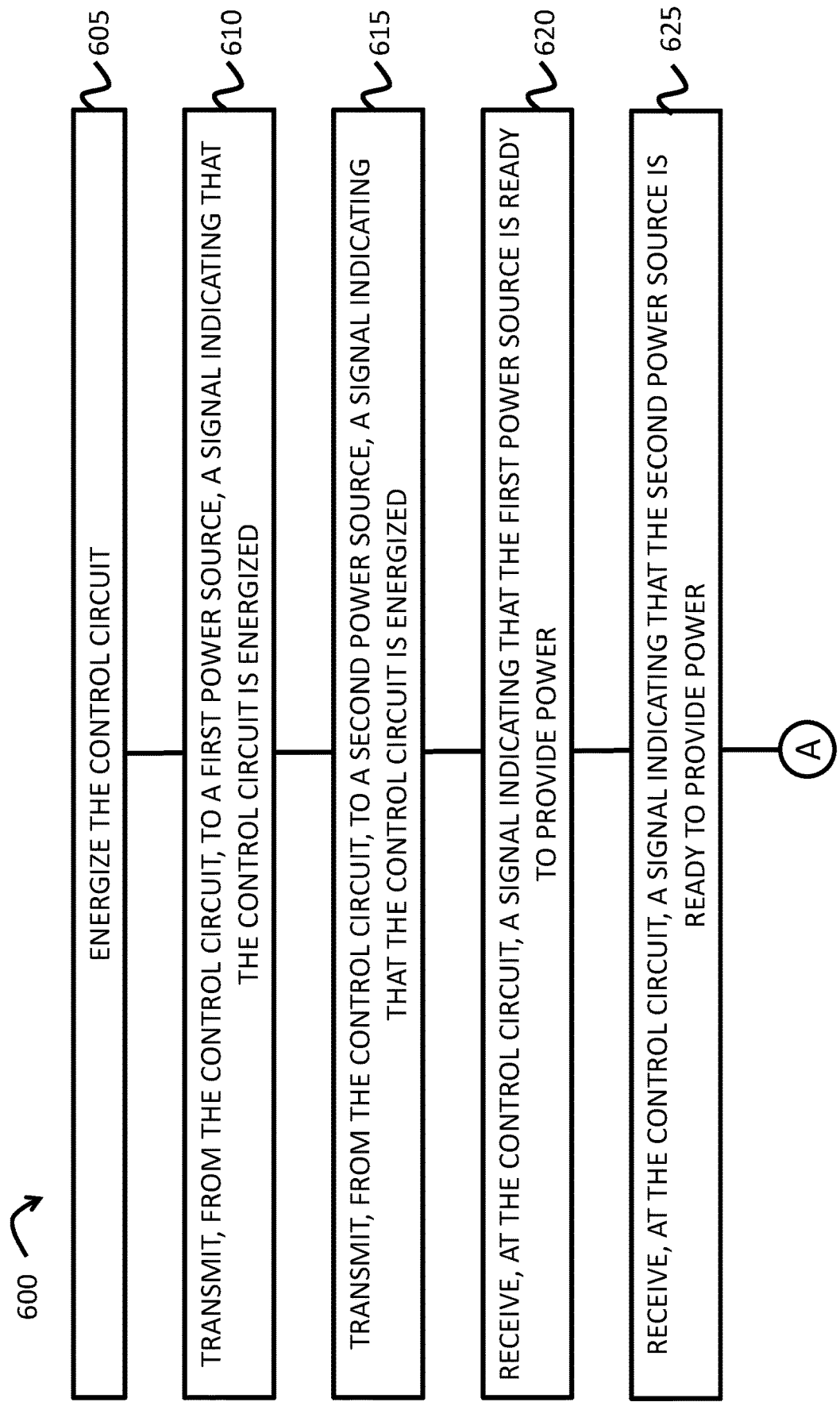
FIGS. 9A and 9B are a sequence diagram showing operations of a method for controlling delivery of power to one or more servers according to an embodiment.
Figure 9B:
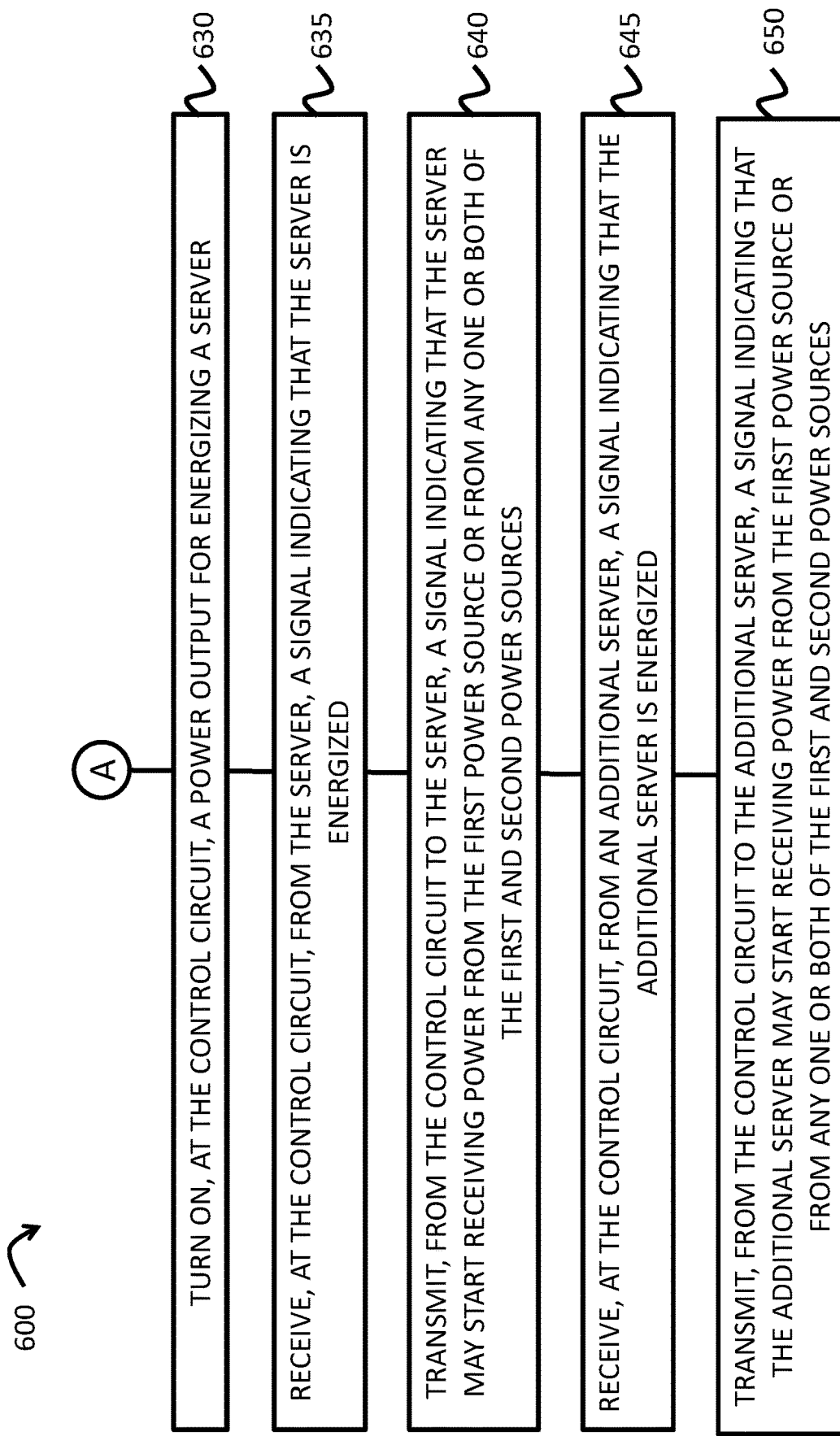

FIGS. 9A and 9B are a sequence diagram showing operations of a method for controlling delivery of power to one or more servers according to an embodiment. On FIGS. 9A and 9B, a sequence 600 comprises a plurality of operations, some of which may be executed in variable order, some of the operations possibly being executed concurrently, some of the operations being optional. The sequence 600 may be implemented, for example and without limitation, in the power supply combination 200 or 300 and, in particular, in the control circuit 500 of FIG. 8. It should be noted, however, that the sequence 600 may be implemented in a power combination having a single power source.

Figure 10:
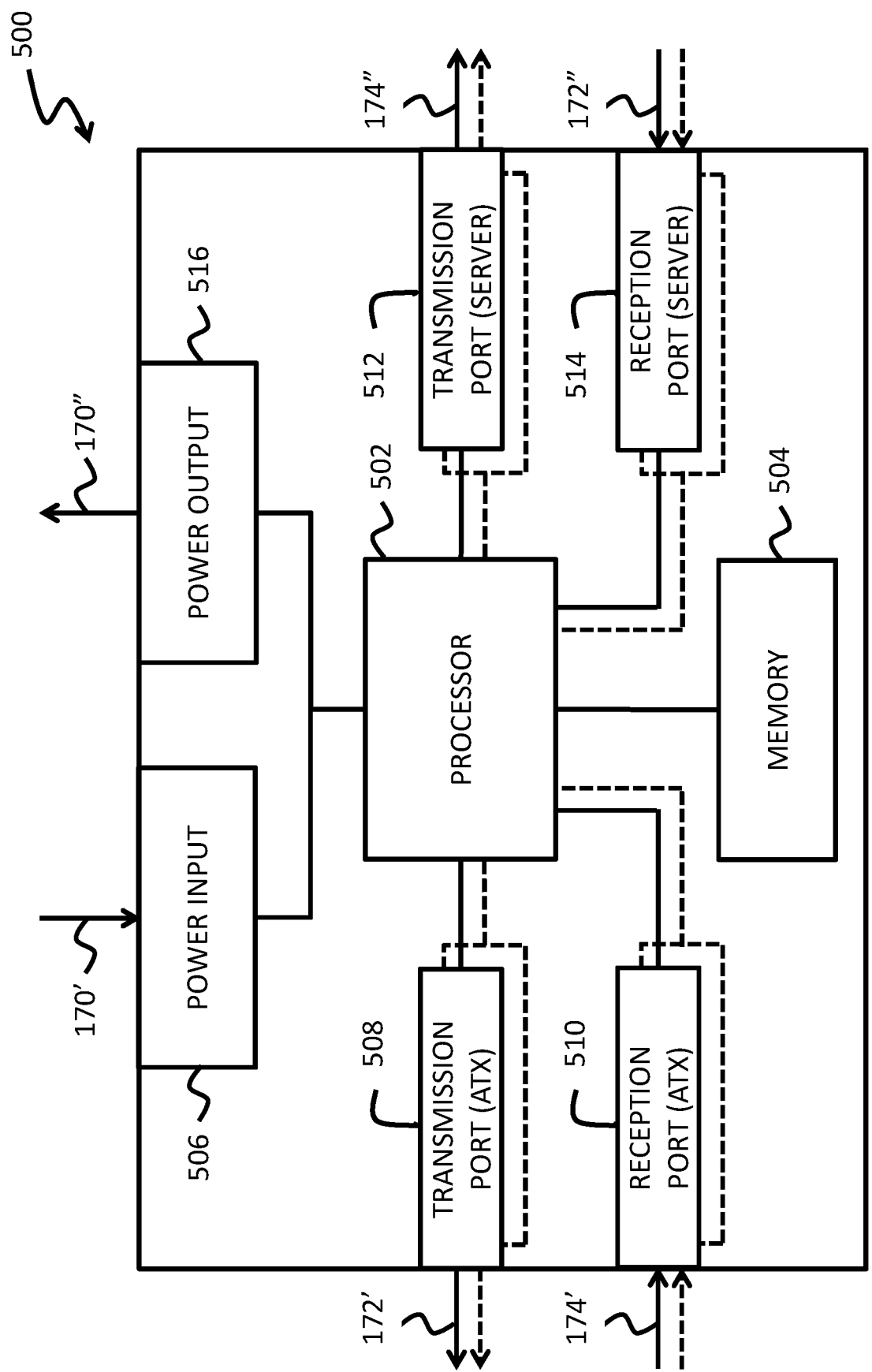
FIG. 10 is a block diagram of the control circuit according to an embodiment.

In an embodiment, the control circuit 500 is energized by receiving standby power at an internal power input (FIG. 10)

at operation 605. At operation 610, the control circuit 500 transmits to a first power source, for example the ATX power supply 130A, a signal indicating that the control circuit 500 is energized. If more than one power source is present, the control circuit 500 transmits to a second power source, for example the ATX power supply 130A, a similar signal indicating that the control circuit 500 is energized. Then, in any order, the control circuit 500 may receive, at operations 620 and 625, signals indicating that the first and second power sources are ready to provide power. When the first and second power sources are the ATX power supplies 130A and 130B, the signals indicating that the control circuit 500 is energized may be PS_ON signals and the signals indicating that the ATX power supplies 130A and 130B are ready to provide power may be PWR_OK signals. Likewise, energizing of the control circuit 500 at operation 605 may be obtained from a standby power source of one or both of the ATX power supplies 130A and 130B via a connection 170'.

If the control circuit 500 supports a connection 170", it may turn on an internal power output (FIG. 10) for energizing a server 160 at operation 630. The power output may be directly connected to the power input within the control circuit 500. In an embodiment, the control circuit 500 may wait until it has received the signal indicating that the first power source is ready to provide power (or until it has received both signals indicating that both the first and second power sources are ready to provide power) before turning on the internal power output. It may be noted that the server 160 may receive standby power either from control circuit 500 via the connection 170" or from the ATX power supply 130A or 130B via a connection 170. Therefore, the connection 170" may or may not be present in distinct embodiments.

At operation 635, the control circuit 500 may receive, from the server 160, a signal indicating that the server 160 is energized. This signal may be a PS_ON signal if the server 160 is constructed to receive power from an ATX power supply. Then at operation 640, optionally after a time delay, for example 500 milliseconds after completion of operation 635, the control circuit 500 transmits to the server 160 a signal indicating that the server 160 may start receiving power from the first power source, if only one power source is present, or from any one or both of the first and second power sources. The signal indicating that the server 160 may start receiving power may be a PWR_OK signal if the server 160 is constructed according to ATX specifications.

In case where the server 160 receives standby power directly from one of the ATX power supplies 130A or 130B via a connection 170, operation 635 in which the server 160 sends to the control circuit 500 the signal indicating that it is energized may precede the reception, at the control circuit 500, of the signal (or signals) indicating that the first power source (or the first and second power sources) is (are) ready to provide power. Regardless, operation 640 is only performed once operation 620 (or operations 620 and 625, if applicable) and operation 635 have all been performed.

It is observed that operations 605 to 640 may be performed while the server 160 is being connected to the power source (or sources) and to the control circuit 500. Alternatively, operations 605 to 640 may all be performed at a time when the server 160 has previously been physically connected to the power sources. Power may or may not already be available on power rails of the power sources, for example the power rails 134A, 136A, 138A, 134B, 13B6 and 138B of the ATX power supplies 130A and 130B, when the server 160 is physically connected. However, the power supply combinations 200 and 300 may be intended to provide power to a plurality of servers 160, some new servers 160 being added to the power supply combinations while other servers 160 are already in operation.

Following execution of operation 640 in which the server 160 has been placed in operation, a new signal may be received at the control circuit 500, at operation 645. This new signal indicates that an additional server is energized. This new signal may be a PS_ON signal. In response, at operation 650, optionally after a time delay, for example 500 milliseconds after completion of operation 645, the control circuit 500 transmits to the additional server 160 a signal indicating that the additional server 160 may start receiving power from the first power source, if only one power source is present, or from any one or both of the first and second power sources. The signal indicating that the additional server 160 may start receiving power may be a PWR_OK signal if the additional server 160 is constructed according to ATX specifications.

Each of the operations of the sequence 600 may be configured to be processed by one or more processors, the one or more processors being coupled to one or more memory devices. For example, FIG. 10 is a block diagram of the control circuit according to an embodiment. The control circuit 500 introduced in the description of FIG. 8 may comprise a processor or a plurality of cooperating processors (represented as a processor 502 for simplicity), a memory device or a plurality of memory devices (represented as a memory device 504 for simplicity), and a power input 506 providing power to the processor 502 and to other components of the control circuit 500. Power may be received at the power input 506 via a connection 170'.

The processor 502 is operatively connected to a number of input and output devices. These include one or more transmission ports 508, each of which is connectable to a respective power source, for example and without limitation to one of the ATX power supplies 130A and 130B introduced earlier, via the signalling leads 172' and one or more reception ports 510 that are connectable to the ATX power supplies 130A and 130B via the signalling leads 174'. One pair comprising one transmission port 508 and one reception port 510 is dedicated for connection with each ATX power supply 130A or 130B. The input and output devices also include one or more transmission ports 512, each of which is connectable to a respective server 160 via a signalling lead 174" and one or more reception ports 514 that are connectable to respective servers 160 via the signalling leads 172". One pair comprising one transmission port 512 and one reception port 514 is dedicated for connection with each server 160. A power output 516 may be internally connected to the power input 506 and provide standby power to initially energize one of more servers 160 via connections 170".

The connections 170' and 170", as well as the signalling leads 172', 174', 172" and 174" are those introduced in the description of FIG. 8.

In an embodiment, for consistency with the standard manner of connecting ATX power supplies to servers via dedicated wire connections carrying the PS_ON and PWR_OK signals, a pair of transmission and reception ports 508 and 510 may be provided for each ATX power supply 130A or 130B being used in conjunction with the control circuit 500. In the same embodiment, a pair of transmission and reception ports 512 and 514 may be provided for each server 160 being used in conjunction with the control circuit 500. In some other embodiments, some of the transmission ports and reception ports may be combined in a lesser number of units.

The memory device 504 may comprise a non-transitory computer-readable medium for storing instructions that are executable by the processor 502 for executing the various operations of the sequence 600. In more details, the processor 502 may detect that the power input 506 is energized. In response to this detection, the processor 502 causes the transmission port 508 to transmit to the ATX power supply 130A or 130B a first signal indicating that the control circuit 500 is energized (the first signal is sent to each ATX power supply by respective transmission ports 508, if more than one ATX power supply is connected to the control circuit 500). The processor 502 then receives, from the reception port 510, a second signal indicating that the ATX power supply 130A or 130B is ready to provide power. The processor 502 also receives, from a reception port 514, a third signal indicating that a corresponding server 160 is energized. A plurality of servers 160 may each send a respective third signal received on a corresponding reception port 514. Each third signal received from distinct servers 160 is treated separately.

The third signal may be received earlier or later than the second signal. In one embodiment, the processor 520 may cause the power output 516 to start providing standby power to one or more connected servers 160 via the connection 170″ after having received the second signal. In this embodiment, the server(s) 160 may only send the third signal after this provision of standby power from the power output 516. In another embodiment, the server(s) may receive standby power directly from the ATX power supply 130A or 130B. In the latter embodiment, the third signal may precede or follow the second signal.

After having receiving both the second signal indicating that the ATX power supply 130A or 130B is ready to provide power and the third signal indicating that the server 160 is energized, the processor 502 causes the transmission port 512 paired with the reception port 514 having received the third signal to transmit, to the server 160, a fourth signal indicating that the server 160 may start receiving power from the ATX power supply 130A or 130B. The processor 502 may delay the sending of the fourth signal to ensure a minimal time gap between receiving the third signal and transmitting the fourth signal.

While the above-described implementations have been described and shown with reference to particular steps performed in a particular order, it will be understood that these steps may be combined, sub-divided, or re-ordered without departing from the teachings of the present technology. At least some of the steps may be executed in parallel or in series. Accordingly, the order and grouping of the steps is not a limitation of the present technology.

It should be expressly understood that not all technical effects mentioned herein need to be enjoyed in each and every embodiment of the present technology.

Modifications and improvements to the above-described implementations of the present technology may become apparent to those skilled in the art. The foregoing description is intended to be exemplary rather than limiting. The scope of the present technology is therefore intended to be limited solely by the scope of the appended claims.

What is claimed is:

1. A power supply combination, comprising:
a first multi-voltage power source comprising a first power rail adapted to deliver power at a first voltage and a second power rail adapted to deliver power at a second voltage;
a second multi-voltage power source comprising a third power rail adapted to deliver power at the first voltage and a fourth power rail adapted to deliver power at the second voltage;
a first single-voltage power source comprising a fifth power rail adapted to deliver power at the first voltage;
a second single-voltage power source comprising a sixth power rail adapted to deliver power at the first voltage;
a first power combining circuit electrically connected to the first power rail of the first multi-voltage power source, to the third power rail of the second multi-voltage power source, to the fifth power rail of the first single-voltage power source, and to the sixth power rail of the second single-voltage power source, the first power combining circuit being adapted to deliver power at the first voltage to a first voltage input of a load; and
a second power combining circuit electrically connected to the second power rail of the first multi-voltage power source and to the fourth power rail of the second multi-voltage power source, the second power combining circuit being adapted to deliver power at the second voltage to a second voltage input of the load.

2. The power supply combination of claim 1, wherein the load comprises one or more servers.

3. The power supply combination of claim 1, wherein:
the first power combining circuit comprises a first diode connecting the first power rail of the first multi-voltage power source to the first voltage input of the load, a third diode connecting the third power rail of the second multi-voltage power source to the first voltage input of the load, a fifth diode connecting the fifth power rail of the first single-voltage power source to the first voltage input of the load and a sixth diode connecting the sixth power rail of the second single-voltage power source to the first voltage input of the load; and
the second power combining circuit comprises a second diode connecting the second power rail of the first multi-voltage power source to the second voltage input of the load and a fourth diode connecting the fourth power rail of the second multi-voltage power source to the second voltage input of the load.

4. The power supply combination of claim 1, wherein:
the first power combining circuit comprises a first emulating circuit connecting the first power rail of the first multi-voltage power source to the first voltage input of the load; a third emulating circuit connecting the third power rail of the second multi-voltage power source to the first voltage input of the load; a fifth emulating circuit connecting the fifth power rail of the first single-voltage power source to the first voltage input of the load; and a sixth emulating circuit connecting the sixth power rail of the second single-voltage power source to the first voltage input of the load;
the second power combining circuit comprises a second emulating circuit connecting the second power rail of the first multi-voltage power source to the second voltage input of the load and a fourth emulating circuit connecting the fourth power rail of the second multi-voltage power source to the second voltage input of the load; and
each of the first, second, third, fourth, fifth and sixth emulating circuit is adapted to operate as an ideal diode.

5. The power supply combination of claim 1, further comprising:

a first voltage comparator comprising:
  a first sensing input electrically connected to the first power rail of the first multi-voltage power source,
  a third sensing input electrically connected to the third power rail of the second multi-voltage power source,
  a fifth sensing input electrically connected to the fifth power rail of the first single-voltage power source, and
  a sixth sensing input electrically connected to the sixth power rail of the second single-voltage power source,
  the first voltage comparator being adapted to compare voltages sensed by the first, third, fifth and sixth sensing inputs to detect a failure of one of the first and second multi-voltage power sources to deliver power at the first voltage or a failure of one of the first and second single-voltage power sources to deliver power at the first voltage;
a second voltage comparator comprising:
  a second sensing input electrically connected to the second power rail of the first multi-voltage power source, and
  a fourth sensing input electrically connected to the fourth power rail of the second multi-voltage power source,
  the second voltage comparator being adapted to compare voltages sensed by the second and fourth sensing inputs to detect a failure of one of the first and second multi-voltage power sources to deliver power at the second voltage; and
a monitoring device operatively connected to the first and second voltage comparators and adapted to report a detected failure of one of the first and second multi-voltage power sources or a detected failure of one of the first and second single-voltage power sources.

6. The power supply combination of claim 5, wherein the first power combining circuit, the second power combining circuit, the first voltage comparator, the second voltage comparator and the monitoring device are mounted on a common platform.

7. The power supply combination of claim 5, wherein:
the first and second multi-voltage power sources are adapted to convert power received from a power distribution unit (PDU) into power delivered at the first and second voltages;
the first and second single-voltage power sources are adapted to convert power received from the PDU into power delivered at the first voltage; and
the monitoring device is communicatively connected to the PDU and is adapted to send a signal to the PDU to report the detected failure of one of the first and second multi-voltage power sources or of one of the first and second single-voltage power sources.

8. The power supply combination of claim 1, wherein:
the first multi-voltage power source further comprises a seventh power rail adapted to deliver power at a third voltage;
the second multi-voltage power source further comprises an eighth power rail adapted to deliver power at the third voltage; and
the power supply combination further comprises a third power combining circuit electrically connected to the seventh power rail of the first multi-voltage power source and to the eighth power rail of the second multi-voltage power source, the second power combining circuit being adapted to deliver power at the third voltage to a third voltage input of the load.

9. The power supply combination of claim 8, wherein:
the first and second multi-voltage power sources are ATX power supplies;
the first voltage is 12 volts DC;
the second voltage is 3.3 volts DC; and
the third voltage is 5 volts DC.

10. The power supply combination of claim 8, wherein:
the first power combining circuit comprises a first diode connecting the first power rail of the first multi-voltage power source to the first voltage input of the load, a third diode connecting the third power rail of the second multi-voltage power source to the first voltage input of the load, a fifth diode connecting the fifth power rail of the first single-voltage power source to the first voltage input of the load and a sixth diode connecting the sixth power rail of the second single-voltage power source to the first voltage input of the load;
the second power combining circuit comprises a second diode connecting the second power rail of the first multi-voltage power source to the second voltage input of the load and a fourth diode connecting the fourth power rail of the second multi-voltage power source to the second voltage input of the load; and
the third power combining circuit comprises a seventh diode connecting the seventh power rail of the first multi-voltage power source to the second voltage input of the load and an eighth diode connecting the eighth power rail of the second multi-voltage power source to the second voltage input of the load.

11. The power supply combination of claim 8, wherein:
the first power combining circuit comprises a first emulating circuit connecting the first power rail of the first multi-voltage power source to the first voltage input of the load, a third emulating circuit connecting the third power rail of the second multi-voltage power source to the first voltage input of the load, a fifth emulating circuit connecting the fifth power rail of the first single-voltage power source to the first voltage input of the load and a sixth emulating circuit connecting the sixth power rail of the second single-voltage power source to the first voltage input of the load;
the second power combining circuit comprises a second emulating circuit connecting the second power rail of the first multi-voltage power source to the second voltage input of the load and a fourth emulating circuit connecting the fourth power rail of the second multi-voltage power source to the second voltage input of the load;
the third power combining circuit comprises a seventh emulating circuit connecting the fifth power rail of the first multi-voltage power source to the third voltage input of the load and a sixth emulating circuit connecting the eight power rail of the second multi-voltage power source to the third voltage input of the load; and
each of the first, second, third, fourth, fifth, sixth, seventh and eighth emulating circuit is adapted to operate as an ideal diode.

12. The power supply combination of claim 8, further comprising:
a first voltage comparator comprising:
  a first sensing input electrically connected to the first power rail of the first multi-voltage power source,
  a third sensing input electrically connected to the third power rail of the second multi-voltage power source, a fifth sensing input electrically connected to the fifth power rail of the first single-voltage power source, and a sixth sensing input electrically connected to the sixth power rail of the second single-voltage power source, the first voltage comparator being adapted to compare voltages sensed by the first, third, fifth and sixth sensing inputs to detect a failure of one of the first and second multi-voltage power sources to deliver power at the first voltage or a failure of one of the first and second single-voltage power sources to deliver power at the first voltage;

a second voltage comparator comprising:
  a second sensing input electrically connected to the second power rail of the first multi-voltage power source, and
  a fourth sensing input electrically connected to the fourth power rail of the second multi-voltage power source,
  the second voltage comparator being adapted to compare voltages sensed by the second and fourth sensing inputs to detect a failure of one of the first and second multi-voltage power sources to deliver power at the second voltage;

a third voltage comparator comprising:
  a seventh sensing input electrically connected to the seventh power rail of the first multi-voltage power source, and
  an eighth sensing input electrically connected to the eighth power rail of the second multi-voltage power source,
  the third voltage comparator being adapted to compare voltages sensed by the seventh and eighth sensing inputs to detect a failure of one of the first and second multi-voltage power sources to deliver power at the third voltage; and a monitoring device operatively connected to the first, second and third voltage comparators and adapted to report a detected failure of one of the first and second multi-voltage power sources or a detected failure of one of the first and second single-voltage power sources.

13. The power supply combination of claim 12, wherein the first power combining circuit, the second power combining circuit, the third power combining circuit, the first voltage comparator, the second voltage comparator, the third voltage comparator and the monitoring device are mounted on a common platform.

14. The power supply combination of claim 12, wherein:
  the first and second multi-voltage power sources are adapted to convert power received from a power distribution unit (PDU) into power delivered at the first, second and third voltages;
  the first and second single-voltage power sources are adapted to convert power received from the PDU into power delivered at the first voltage; and
  the monitoring device is communicatively connected to the PDU and is adapted to send a signal to the PDU to report the detected failure of one of the first and second multi-voltage power sources or of one of the first and second single-voltage power sources.

15. A power supply network, comprising:
a plurality of power supply combinations as defined in claim 12; and
a power management unit communicatively connected to the monitoring device of each of the power supply combinations, the power management unit being configured to:
  receive, from the monitoring devices, the reports of detected failures of any one of the multi-voltage power or single-voltage power sources of any one of the plurality of power supply combinations,
  determine a relative urgency related to each received report of detected failure, and
  cause a display to present each report of detected failure along with the corresponding relative urgency.

* * * * *